United States Patent
Hasegawa et al.

(10) Patent No.: US 6,625,686 B2
(45) Date of Patent: Sep. 23, 2003

(54) MULTIPORT MEMORY, DATA PROCESSOR AND DATA PROCESSING SYSTEM

(75) Inventors: Masami Hasegawa, Ome (JP); Yoichi Satoh, Iruma (JP); Yuuji Yanagisawa, Sayama (JP); Yoshio Iioka, Ome (JP); Yoshimi Kitagawa, Tokorozawa (JP); Makio Uchida, Sayama (JP)

(73) Assignees: Hitachi, Ltd., Tokyo (JP); Hitachi ULSI Systems, Co., Ltd., Tokyo (JP)

( * ) Notice: Subject to any disclaimer, the term of this patent is extended or adjusted under 35 U.S.C. 154(b) by 0 days.

(21) Appl. No.: 10/214,124

(22) Filed: Aug. 8, 2002

(65) Prior Publication Data

US 2002/0194424 A1 Dec. 19, 2002

Related U.S. Application Data

(63) Continuation of application No. 09/353,367, filed on Jul. 15, 1999.

(30) Foreign Application Priority Data

Aug. 10, 1998 (JP) ............................................. 10-225593

(51) Int. Cl.[7] .............................................. G06F 12/00
(52) U.S. Cl. ........................ 711/104; 711/167; 711/149; 365/233
(58) Field of Search ................................. 711/104, 149, 711/167–168; 365/233; 709/209

(56) References Cited

U.S. PATENT DOCUMENTS

| | | | | |
|---|---|---|---|---|
| 4,698,753 A | * | 10/1987 | Hubbins et al. | ............. 709/209 |
| 5,422,858 A | * | 6/1995 | Mizukami et al. | .......... 365/233 |
| 5,625,796 A | * | 4/1997 | Kaczmarczyk et al. | ..... 711/168 |
| 5,802,579 A | * | 9/1998 | Crary | .......................... 711/149 |
| 5,852,586 A | * | 12/1998 | Fujita | .......................... 365/233 |

FOREIGN PATENT DOCUMENTS

JP        1-251387       10/1989

* cited by examiner

*Primary Examiner*—Do Hyun Yoo
*Assistant Examiner*—Nasser Moazzami
(74) *Attorney, Agent, or Firm*—Mattingly, Stanger & Malur, P.C.

(57) ABSTRACT

A multiport memory has a plurality of RAMs and a port expansion unit electrically connected to access ports of the RAMs. The port expansion unit includes an input circuit which allows access control information for activating the RAMs in parallel every memory cycles to be collectively inputted thereto by a plurality of memory cycles, a timing generator which generates internal clock signals capable of serially prescribing each memory cycle plural times during one cycle of a clock signal (ck), and a logic circuit capable of sequentially supplying the access control information inputted to the input circuit to the plurality of RAMs in parallel in parts every serial memory cycles synchronized with the internal clock signals. The port expansion unit allows access to the access ports with the plurality of RAMs as a single multiport memory apparently.

3 Claims, 14 Drawing Sheets

8 PORT RAM (USING TWO 2-PORT RAMS)

| INTERNAL RAM | | FIRST ($\phi 1$) | SECOND ($\phi 2$) | THIRD ($\phi 3$) |
|---|---|---|---|---|
| RAM 40 | PORT1 | AD (R1) DO (R1) | AD (W1) DI (W1) | AD (W3) DI (W3) |
| | PORT2 | AD (R2) DO (R2) | AD (W2) DI (W2) | AD (W4) DI (W4) |
| RAM 41 | PORT1 | AD (R3) DO (R3) | AD (W1) DI (W1) | AD (W3) DI (W3) |
| | PORT2 | AD (R4) DO (R4) | AD (W2) DI (W2) | AD (W4) DI (W4) | ns
MULTIPORT MEMORY, DATA PROCESSOR AND DATA PROCESSING SYSTEM

This is a continuation application of U.S. Ser. No. 09/353,367 filed Jul. 15, 1999.

BACKGROUND OF THE INVENTION

The present invention relates to a technique capable of utilizing a plurality of RAMs as a single multiport memory apparently, and to a technique effective for application to, for example, a multiport memory, and a data processor or the like called a microcomputer or a microprocessor or the like.

The present inventors have discussed multiporting of a semiconductor memory. For example, memory cells of a multiport memory capable of parallel access completely in theory are respectively provided with data input/output terminals and memory-cell selection terminals by the number of ports. Thus, bit lines and word lines are provided as plural pairs and transistors for selecting the memory cells are provided every pairs of the respective bit lines and word lines. Therefore, when the numbers of the word lines and the bit lines increase according to the required number of ports, each memory chip greatly increases in area. There is also an increasingly fear of the occurrence of a malfunction due to crosstalk or the like that occurs between the adjacent bit lines. As a result, limitations are spontaneously placed on an increase in the number of ports in a single memory.

Thus, a multiport RAM can be apparently constructed using a plurality of RAMs. This technique has been described in Japanese Patent Application Laid-Open No. Hei 1-251387 (1989). When, for example, two two-port RAMs having parallel accessible write and read ports are used so as to constitute a single three-port RAM apparently, the same data must be written into the two two-port RAMs upon data writing. Therefore, the write ports of the two two-port RAMs are connected in common as one port. Similarly, even when n (n: integer greater than or equal to 3) pieces of the two-port RAMs are used to constitute a multiport memory having n+1 ports apparently, write ports of the n two-port RAMs must be connected in common. Such a multiport RAM cannot perform a parallel write access to different data upon writing but is able to perform a parallel read access to n different data with respect to n ports upon reading. However, a problem arises in that since the number of memory chips activated in parallel according to the required number of ports, the amount of power consumption will increase.

On the other hand, the present inventors have previously filed the invention about the multiporting (see U.S. Pat. No. 5,422,858 (Jun. 6, 1995)). According to this, a speed or rate converter for converting each address or data into parallel/serial form and interfacing to the outside is provided at an access port of each memory to thereby set an internal memory access rate to, for example, twice an external access rate, whereby a single-port RAM is accessible as a dual-port RAM apparently. According to this construction, even if the number of memories is not increased, the apparent number of ports can be increased by a logical configuration of the rate converter as in the case of an increase in the apparent number of multiport or multiple ports with respect to one port, e.g., four ports and eight ports.

SUMMARY OF THE INVENTION

Since RAMs are serially activated to increase the number of multiport or multiple ports apparently when the rate converter is used, the number of the RAMs to be activated in parallel can be reduced, thereby making it possible to contribute to low power consumption as compared with the prior art. However, the present inventors have revealed the problem that when the apparent number of multiport or multiple ports is increased without an increase in the number of the memories, a time interval required to determine all the data read from all the read ports increased apparently is delayed with the increase in the apparent number of multiple ports from the relationship in which actual accesses to the memories are serially performed.

An object of the present invention is to provide a multiport memory capable of contributing to low power consumption and improving a delay in apparent parallel read access even if the number of multiport or multiple ports apparently increases.

Another object of the present invention is to allow the implementation of a single multiport memory by using general-purpose memory chips, and to provide a data processor capable of providing low power consumption for the implemented multiport memory and improving a delay in apparent parallel read access even when the apparent number of multiport or multiple ports increases.

A further object of the present invention is to reduce the cost of a data processing system using a multiport memory and the amount of power consumption thereof.

The above and other objects, and novel features of the present invention will become apparent from the description of the present specification and the accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Summaries of typical ones of the inventions disclosed in the present application will be described in brief as follows:

[1] A multiport memory has a plurality of RAMs and a port expansion unit (12, 22, 32, 42) electrically connected to access ports of the plurality of RAMs. The port expansion unit includes an input circuit which allows access control information for operating the plurality of RAMs in parallel every memory cycles to be collectively inputted thereto by a plurality of memory cycles, a timing generator for generating an internal clock signal capable of defining or prescribing the memory cycles serially plural times during one cycle of a clock signal supplied from the outside, and a logic circuit capable of sequentially supplying the access control information inputted to the input circuit to the plurality of RAMs in parallel in parts every serial memory cycles synchronized with the internal clock signal. The present port expansion unit allows an access with the plurality of RAMs as an apparently-single multiport memory.

According to the above description, since the individual RAMs are serially activated to increase the number of multiport or multiple ports apparently, the number of RAMs to operate in parallel can be reduced, thereby making it possible to contribute to low power consumption as compared with the prior art. Further, since a plurality of RAMs are used, the individual RAMs can be substantially accessed in parallel as regards a read access even when each individual RAMs are given in the form of a single port, whereby a delay in apparent parallel read access to be executed from the outside can be improved. This is the same as above even when the RAM has a multiport. As to a write access on the other hand, since each individual RAMs must hold the same data therein, write accesses are substantially made parallel in the respective RAMs by the number of parallel write-accessible ports.

Figure 1:
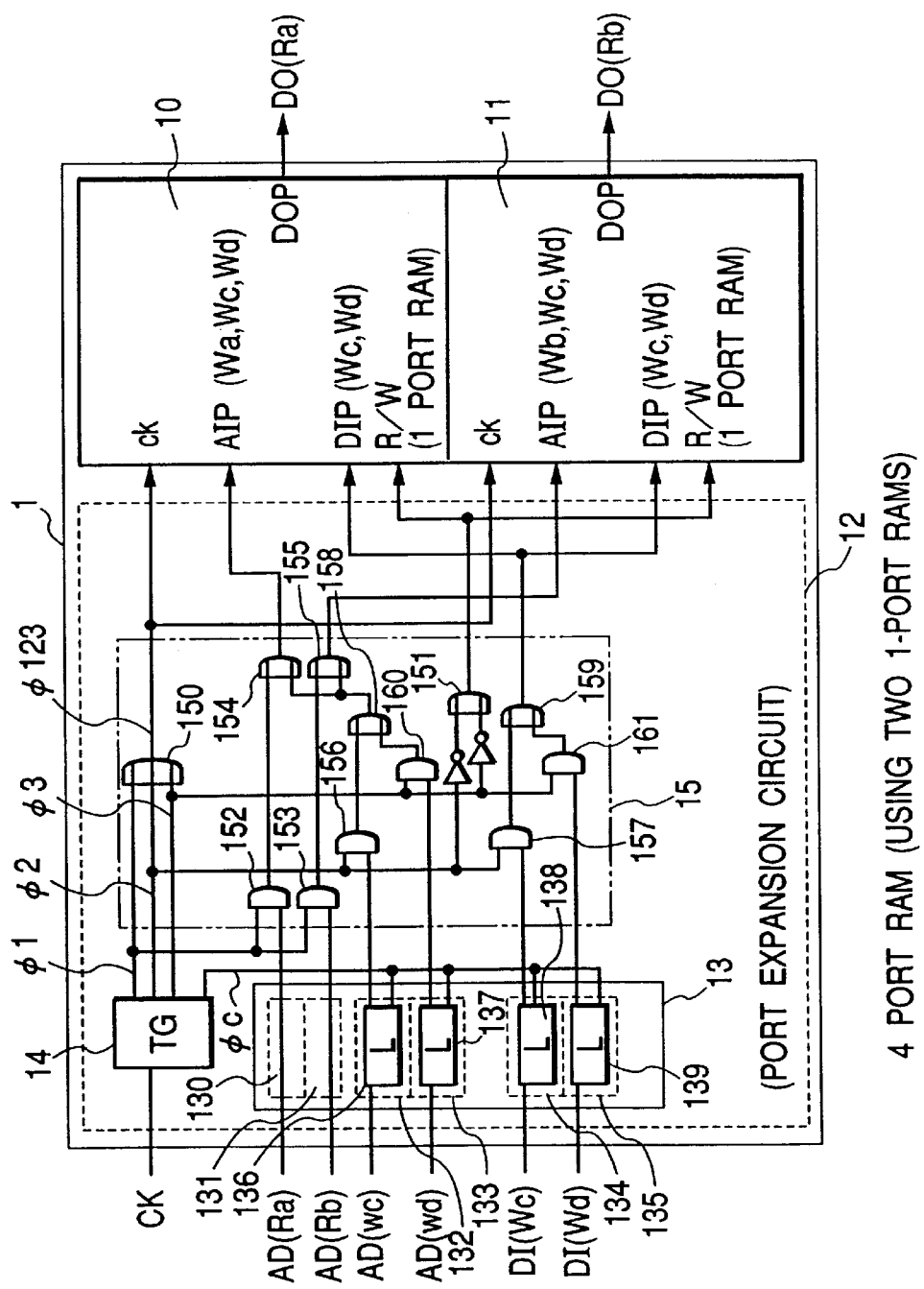
FIG. 1 is a block diagram showing a multiport memory as a first embodiment, which apparently functions as a four-port RAM using two single-port RAMs.

In a first specific embodiment of the present invention, the respective RAMs referred to above are single port RAMs (10 and 11) which incorporate therein memory cells each having a data input/output terminal and a selection terminal as one pair as illustrated in FIG. 1 by way of example. At this time, the input circuit (13) has read address input circuits (130 and 131), write address input circuits (132 and 133) and write data input circuits (134 and 135) corresponding to numbers respectively equal to the number of the single-port RAMs. The write address input circuits have latches (136 and 137) respectively, and the write data input circuits have circuits (138 and 139) for latching write data therein, respectively. The logic circuit (15) supplies address signals of each individual read address input circuits to their corresponding single-port RAMs in parallel in synchronism with one internal clock signal (φ1) for each cycle of a clock signal (CK) supplied from the outside to thereby allow a read operation, and supplies write addresses and write data latched in the latches provided every write address and write data input circuits to the single-port RAMs in parallel in synchronism with other internal clock signals (φ2 and φ3) sequentially to thereby permit a write operation on a serial basis plural times.

Figure 7:
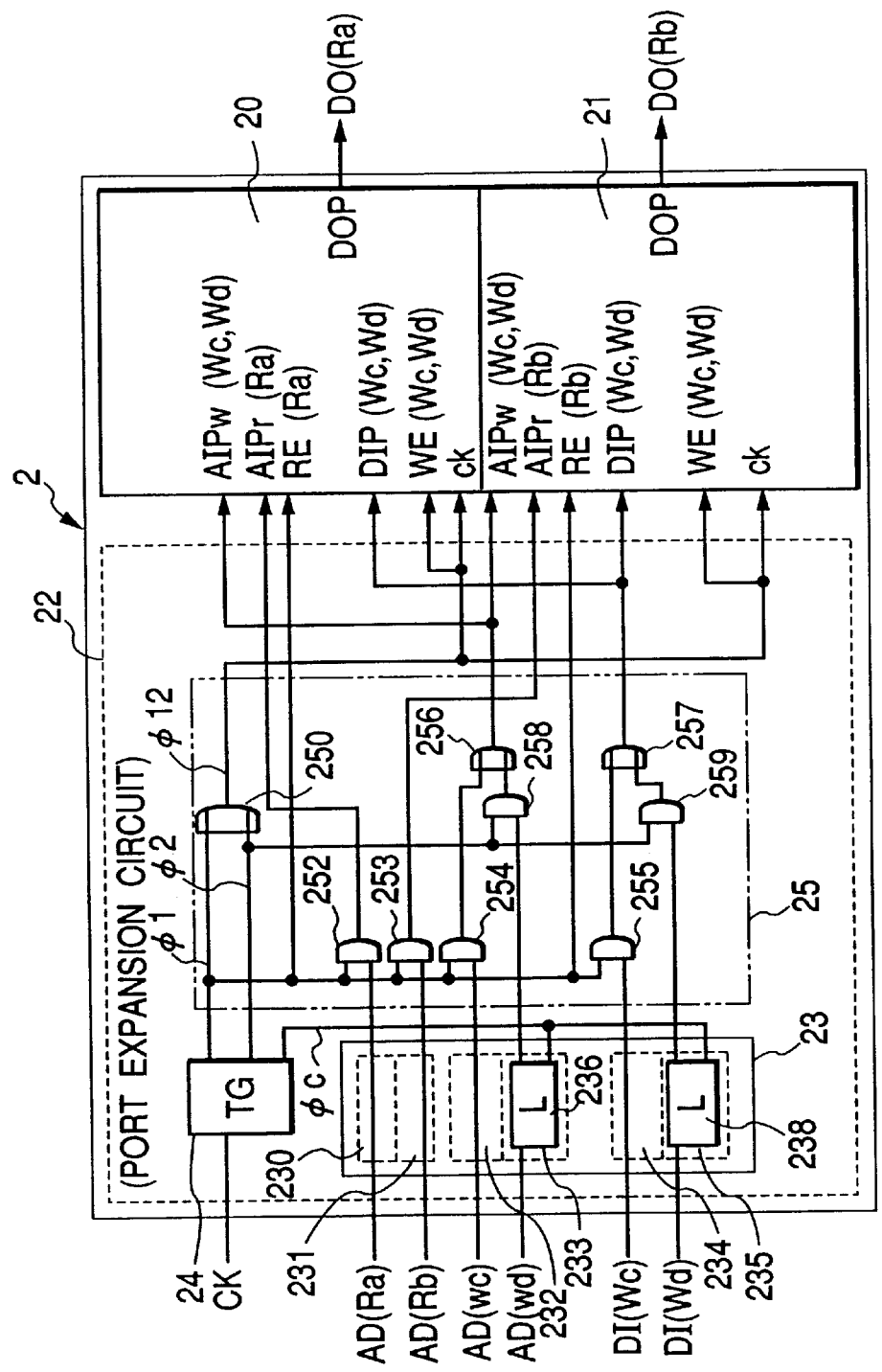
FIG. 7 is a block diagram illustrating a multiport memory as a second embodiment, which apparently functions as a four-port RAM using two two-port RAMs.

In a second specific embodiment of the present invention, the respective RAMs are two-port RAMs (20 and 21) each having two ports, which respectively incorporate therein memory cells having data input/output terminals and selection terminals as two pairs and are accessible in parallel from the outside, as shown in FIG. 7 by way of example. At this time, the input circuit (23) has read address input circuits (230 and 231), write address input circuits (232 and 233) and write data input circuits (234 and 235) corresponding to numbers respectively equal to the number of the two-port RAMs. The write address input circuit has a latch (236) for latching a write address therein and the write data input circuit has a circuit (238) for latching write data therein. The logic circuit (25) supplies address signals of each individual read address input circuits to one ports of their corresponding two-port RAMs in parallel in synchronism with one internal clock signal (φ1) for each cycle of a clock signal (CK) supplied from the outside to thereby allow a read operation, supplies write addresses and write data latched in the latches in one write address and write data input circuits to the other ports of all the two-port RAMs in parallel to thereby permit a write operation, and supplies write addresses and write data latched in the latches of other write address and write data input circuits to all the two-port PAMs in parallel in synchronism with another internal clock signal (φ2) to thereby allow a write operation.

Figure 10:
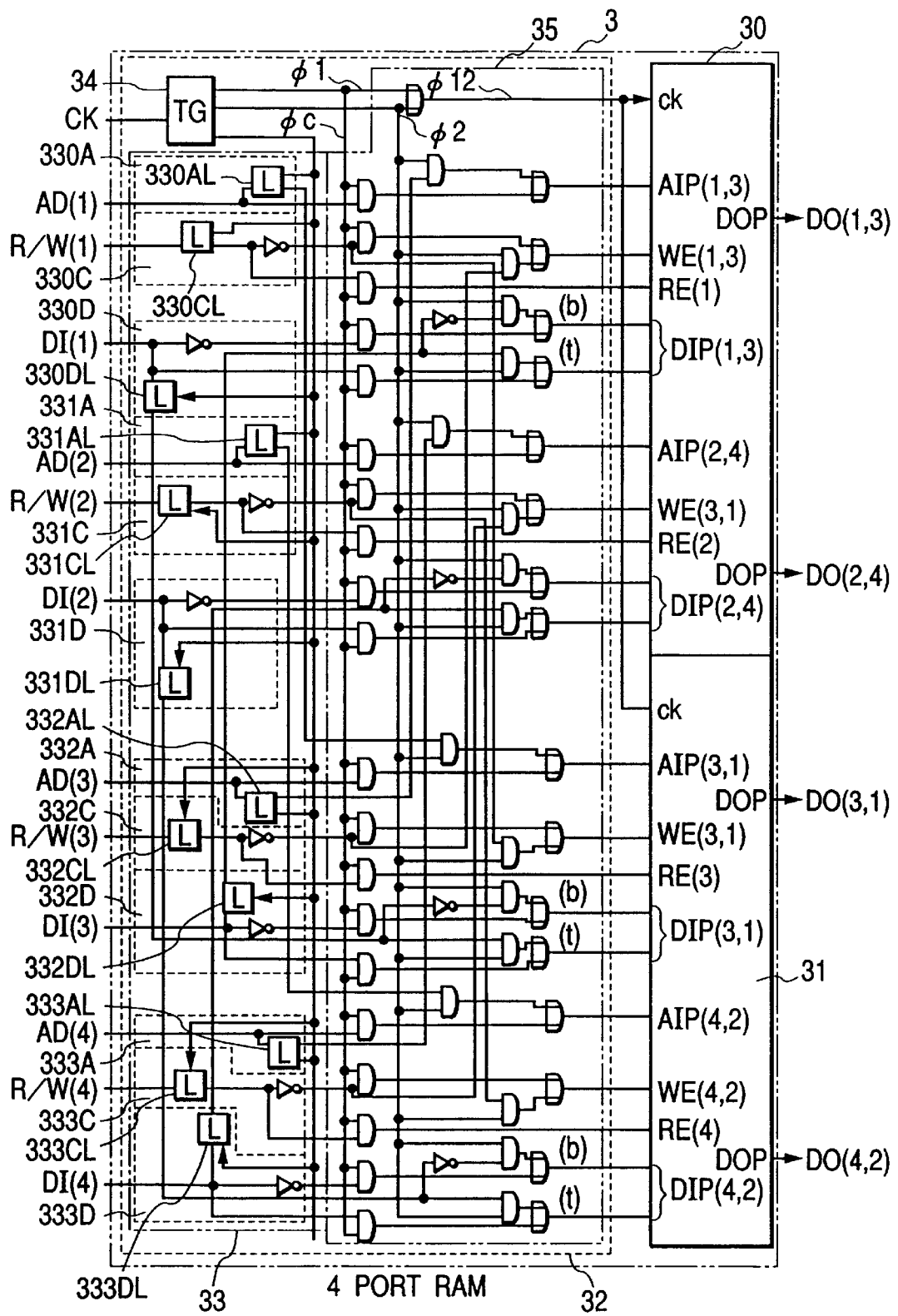
FIG. 10 is a block diagram illustrating a multiport memory as a third embodiment, which apparently functions as a four-port RAM using two single-port RAMS.

In a third specific embodiment of the present invention, the respective RAMs are n two-port RAMs (30 and 31) each having two ports, which respectively incorporate therein memory cells having data input/output terminals and selection terminals as two pairs and are accessible in parallel from the outside, as shown in FIG. 10 by way of example. At this time, the input circuit (33) has address input circuits (330A through 333A), write data input circuits (330D through 333D) and read/write signal input circuits (330C through 333C) in association with the respective ports of the two-port RAMs. The address input circuits have address latches (330AL through 333AL), the write data input circuits have circuits (330DL through 333DL) which latch write data therein, and the read/write signal input circuits have circuits (330CL through 333CL) which latch read/write signals therein, respectively. The timing generator (34) generates mutually non-overlapped first through nth internal clock signals (φ1 an φ2) as the internal clock signals. The logic circuit (35) supplies address signals of each individual address input circuits to which a read operation is specified, to their corresponding ports of two-port RAMs in parallel in synchronism with the first internal clock signal (φ1) for each cycle of a clock signal (CK) supplied from the outside to thereby allow the read operation, and supplies write addresses and write data latched in the latches in the address and write data input circuits to which a write operation is specified, to all the two-port RAMs in synchronism with the first through nth internal clock signals (φ2) sequentially to thereby permit the write operation.

Figure 14:
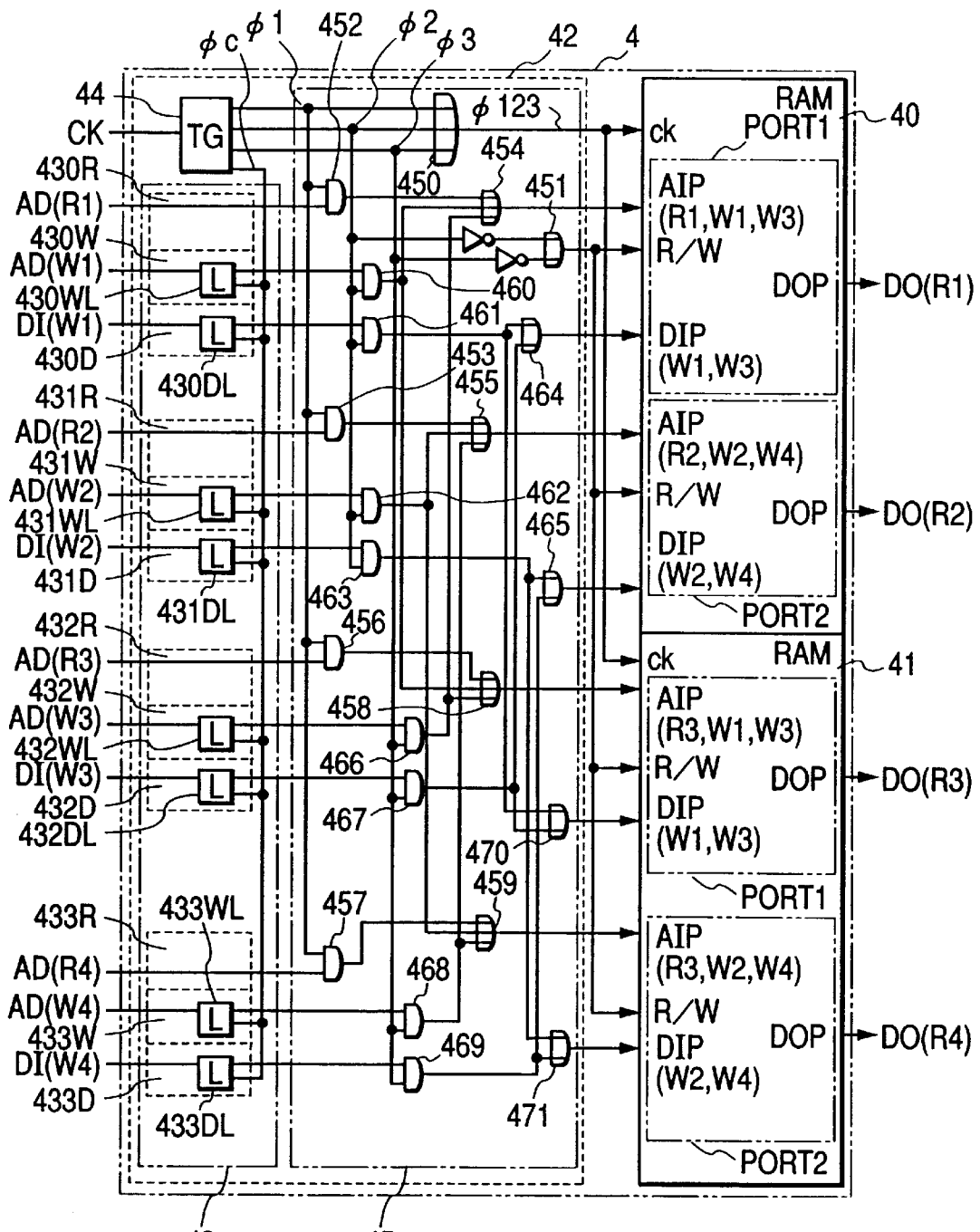
FIG. 14 is a block diagram showing a multiport memory as a four embodiment, which apparently functions as an eight-port RAM using two two-port RAMs.

In a fourth specific embodiment of the present invention, the respective RAMs are n two-port RAMs (40 and 41) each having two ports, which respectively incorporate therein memory cells having data input/output terminals and selection terminals as two pairs and are accessible in parallel from the outside, as shown in FIG. 14 by way of example. At this time, the input circuit (43) has read address input circuits (430R through 433R), write address input circuits (430W through 433W) and write data input circuits (430D through 433D) respectively provided as 2n. The write address input circuits-have latches (430WL through 433WL) which latch addresses therein, and the write data input circuits have circuits (430DL through 433DL) which latch write data therein. The timing generator (44) generates mutually non-overlapped first through n+1th internal clock signals (φ1, φ2 and φ3) as the internal clock signals. The logic circuit (45) supplies address signals of each individual address input circuits to their corresponding two-port RAMs in parallel in synchronism with the first internal clock signal (φ1) for each cycle of a clock signal (CK) supplied from the outside to thereby allow all the RAMs to perform a parallel read operation for separate data, and supplies write addresses and write data latched in the latches in the write address and write data input circuits to all the two-port RAMs in order in synchronism with the second through n+1th internal clock signals (φ2 and φ3) sequentially to thereby allow all the RAMs to perform the operation of sequentially writing the same data.

When each RAM referred to above is one in which the memory cycle is specified or prescribed in synchronism with the clock signal, the timing generator sets the internal clock signals as the mutually non-overlapped clock signals and is capable of supplying a signal indicative of the OR of their non-overlapped internal clock signals to each RAM as an enable clock signal.

When the RAM is assumed to be such a RAM that a bit line level must be precharged to a predetermined level before the start of the read operation, as in a dynamic RAM or static RAM, it is desirable that the logic circuit causes the read operation for the RAM to take precedence over the write operation therefor during a cycle period specified or prescribed by the external clock signal. Upon the write operation, a bit line may be driven by a write amplifier and no precharge operation is required. When the write operation is done before the read operation, the precharge operation for the bit line must be performed before the read operation. Thus, if the read operation takes precedence over the write operation, then an apparent multiport access time interval during which the read operation and the write operation are made continuous, can be shortened.

The multiport memory can be formed into a single semiconductor chip. A general purpose RAM chip may be used for the RAM and the port expansion unit can be also comprised of a TTL circuit.

[2] A data processor (5) comprises a CPU (5) and a port expansion circuit (52) both of which are formed in a semiconductor chip. The port expansion circuit is connected to the CPU via an internal bus and connected to access ports of a plurality of RAMs (60 through 62) provided outside the semiconductor chip. The port expansion circuit allows access to the access ports with the plurality of RAMs being apparently defined as a single multiport memory. Further, the port expansion circuit comprises an input circuit (521) which allows access control information for operating the plurality of RAMs in parallel every memory cycles to be collectively inputted thereto by a plurality of memory cycles, a timing generator (520) for generating a control clock signal capable of prescribing the memory cycles in series plural times during one cycle of a synchronizing clock signal (CK) of the data processor, and a logic circuit (522) capable of sequentially supplying the access control information inputted to the input circuit to the plurality of RAMs in parallel in parts every serial memory cycles synchronized with the control clock signal.

If the data processor provided with the port expansion circuit is used as an external interface circuit, then a multiport memory provided with a required number of read ports apparently can be easily implemented using a single port or dual port general-purpose RAM chip such as DRAM or SDRAM or the like. The multiport memory implemented in this way functionally exhibits the same function as the above-described multiport memory.

[3] A data processing system has an access control circuit (60), a port expansion circuit (61) and a plurality of RAMs (63). The port expansion circuit is electrically connected to the access control circuit and access ports of the plurality of RAMs. Further, the port expansion circuit allows access to the access ports with the plurality of RAMs being apparently defined as a single multiport memory. The port expansion circuit comprises an input circuit which allows access control information for operating the plurality of RAMs in parallel every memory cycles to be collectively inputted thereto by a plurality of memory cycles, a timing generator for generating a control clock signal capable of prescribing the memory cycles in series plural times during one cycle of a clock signal supplied from the outside, and a logic circuit capable of sequentially supplying the access control information inputted to the input circuit to the plurality of RAMs in parallel in parts every serial memory cycles synchronized with the control clock signal.

According to the above, a multiport memory provided with a required number of read ports apparently can be implemented by the port expansion circuit and the RAMs in the same manner as described above. Thus, the data processing system using the multiport memory can be reduced in cost and the amount of power consumption.

<<First Multiport Memory>>

FIG. 1 shows a multiport memory as a first embodiment, which apparently functions as a four-port RAM using two single-port RAMs. The multiport memory 1 shown in the same drawing has two RAMs 10 and 11 and a port expansion unit 12 electrically connected to access ports of the respective RAMs 10 and 11.

The respective RAMs 10 and 11 have circuit configurations identical to each other and are so-called single-port RAMs which incorporate therein memory cells each having a data input/output terminal and a selection terminal as one pair. If each of the RAMs 10 and 11 is of SRAM, for example, then each memory cell can be configured by the static latch form known per se in the art, for example.

In the RAMs 10 and 11, ck indicate clock (enable clock) input terminals, AIP indicate address input terminal groups, DIP indicate data input terminal groups, DOP indicate data output terminal groups, and R/W indicate read/write signal input terminals, respectively. They constitute one access ports (single ports) respectively. The data input terminal group DIP and the data output terminal group DOP are merely separated from each other for convenience's sake and will not constitute a parallel-accessible dual port.

The port expansion unit 12 has an input circuit 13 for allowing access control information AD and DI for activating the RAMs 10 and 11 in parallel every memory cycles to be collectively inputted thereto by a plurality of memory cycles, a timing generator (TG) 14 for generating internal clock signals $\phi 1$, $\phi 2$, $\phi 3$ and $\phi c$ capable of prescribing the memory cycles on a series basis plural times, during one cycle of a clock signal CK supplied from the outside, and a logic circuit 15 capable of sequentially supplying the access control information of the input circuit 13 to the plurality of RAMs in parallel in parts every serial memory cycles synchronized with each internal clock signal referred to above. While the multiport memory 1 is formed in a single semiconductor chip, although not restricted in particular, the RAMs 10 and 11 and the port expansion unit 12 can be formed into separate semiconductor chips.

The input circuit 13 has read address input circuits 130 and 131, write address input circuits 132 and 133 and write data input circuits 134 and 135 corresponding to numbers respectively equal to the number (=2) of the RAMs 10 and 11 (also called single-port RAMs 10 and 11). The number of address input bits for each of the respective address input circuits 130 through 133 is set equal to the numbers of bits for the address input terminal groups AIP of the RAMs 10 and 11. Further, the numbers of bits for the write data input circuits 134 and 135 are also respectively set equal to the numbers of bits for the data input terminal groups DIP of the RAMs 10 and 11.

In the multiport memory 1 shown in FIG. 1, the read address input circuits 130 and 131 constitute two read access ports together with the output terminal groups DOP of the RAMs 10 and 11, the write address input circuit 132 and the write data input circuit 134 constitute a single write access port, and the write address input circuit 133 and the write data input circuit 135 constitute another write access port, respectively. The multiport memory 1 apparently constitutes a RAM having four ports in total, which has two write ports and two read ports.

Although not restricted in particular, the read address input circuits 130 and 131 have unillustrated address input buffers respectively and are supplied with read addresses AD(Ra) and AD(Rb) through signal lines respectively. Although not restricted in particular, the write address input circuits 132 and 133 have unillustrated address input buffers respectively and are supplied with write addresses AD(Wc) and AD(Wd) through signal lines. Latches 136 and 137 for latching write addresses therein are provided at stages next to the unillustrated address input buffers respectively. Although not restricted in particular, the write data input circuits 134 and 135 have unillustrated data input buffers respectively and are supplied with write data DI(Wc) and DI(Wd) through signal lines respectively. Latches 138 and 139 for latching write data therein are provided at stages next to the unillustrated data input buffers respectively. Since the access operations of the RAMs 10 and 11 are performed on a serial basis, the above-described latches 136 through 139 are provided to hold the write addresses and write data supplied in parallel in advance till the commencement of the write operation.

Figure 2:
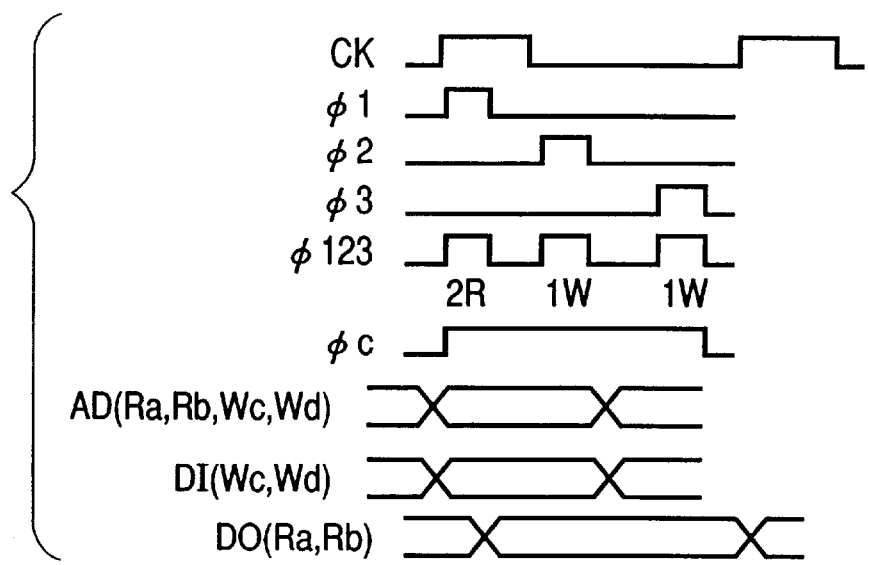
FIG. 2 is a timing chart showing one example of operating timing of the multiport memory shown in FIG. 1.

As shown in FIG. 2 by way of example, the timing generator 14 generates non-overlapped three-phase internal clock signals $\phi 1$, $\phi 2$ and $\phi 3$ during one cycle of the clock signal CK supplied from the outside and outputs a clock signal $\phi c$ which rises in synchronism with the rising edge of the clock signal $\phi 1$ and falls in synchronism with the falling edge of the clock signal $\phi 3$. The clock signals $\phi 1$ through $\phi 3$ and $\phi c$ can be formed by setting a signal indicative of the logical product (negative logical product) of the clock signal CK and a delayed signal of the clock signal CK as a basis and allowing delay times to differ from each other. The latches 136 through 139 are respectively brought to a latched state during a high level of the clock signal $\phi c$. The latches 136 through 139 may be allowed to perform latch operations in synchronism with the rising edge of the clock signal $\phi c$. In this case, the clock signal $\phi c$ can be replaced by $\phi 1$.

The logic circuit 15 serially generates the memory cycles of the RAMs 10 and 11 by three cycles in synchronism with the clock signals $\phi 1$, $\phi 2$ and $\phi 3$ from one cycle of the clock signal CK. Described specifically, an output $\phi 123$ of an OR gate 150 to which the clock signals $\phi 1$, $\phi 2$ and $\phi 3$ are inputted, is supplied to the clock input terminals ck as an enable clock signal for the RAMs 10 and 11. Thus, the RAMs 10 and 11 start memory cycles in synchronism with the rising edge of the signal $\phi 123$. Operating states of the PAMs 10 and 11 at that time are determined according to a signal outputted from an OR gate 151. That is, since the OR gate 151 is supplied with inverted signals of the clock signals $\phi 2$ and $\phi 3$, it provides instructions for a read access in a memory cycle synchronized with a high level of the signal $\phi 1$ and provides instructions for a write access in a memory cycle synchronized with high levels of the signals $\phi 2$ and $\phi 3$. In the read access synchronized with the high level of the signal $\phi 1$, the read addresses AD(Ra) and AD(Rb) are inputted to the address input terminal groups AIP and AIP of the RAMs 10 and 11 through AND gates 152 and 153 and OR gates 154 and 155, so that data DO(Ra) and DO(Rb) are outputted in parallel. In the write access synchronized with the high level of the signal $\phi 2$, the write address AD(Wc) and write data DI(Wc) are supplied in parallel to the two RAMs 10 and 11 through AND gates 156 and 157, OR gates 158, 159 and the OR gates 154 and 155, so that the same data is written therein. In the write access synchronized with the high level of the signal $\phi 3$, the write address AD(Wd) and the write data DI(Wd) are supplied in parallel to the two RAMs 10 and 11 through AND gates 160 and 161 and the OR gates 158, 159, 154 and 155, so that the same data is written therein.

As is understood from the above description, the logic circuit 15 supplies the information (Ra, Rb, Wc and Wd) supplied in parallel in synchronism with the first clock CK to the RAMs 10 and 11 sequentially in series in synchronism with the second clocks ($\phi 1$, $\phi 2$ and $\phi 3$) obtained from the subdivision of the first clock CK. Thus, the logic circuit constitutes a parallel/serial converter.

FIG. 2 shows timing provided to operate the multiport memory 1. As is apparent from the above description, the initial or first memory cycle synchronized with the clock signal $\phi 1$ is a read cycle parallel to the RAMs 10 and 11, based on the different read addresses AD (Ra) and AD (Rb). Thus, the separate data DO(Ra) and DO(Rb) are read in parallel from the RAMs 10 and 11. The next memory cycle synchronized with the clock signal $\phi 2$ is the same write cycle parallel to both RAMs 10 and 11, based on the write address AD(Wc). Thus, the same data DI(Wc) is written into both RAMs 10 and 11 at the same write address AD (Wc). The final memory cycle synchronized with the clock signal $\phi 3$ is the same write cycle parallel to both RAMs 10 and 11, based on the write address AD(Wd). Thus, the same data DI(Wd) is written in both RAMs 10 and 11 at the same write address AD(Wd). Since the two RAMs 10 and 11 have the separate read ports respectively, the individual RAMs 10 and 11 must hold the same data therein with respect to the write access.

Figure 3:
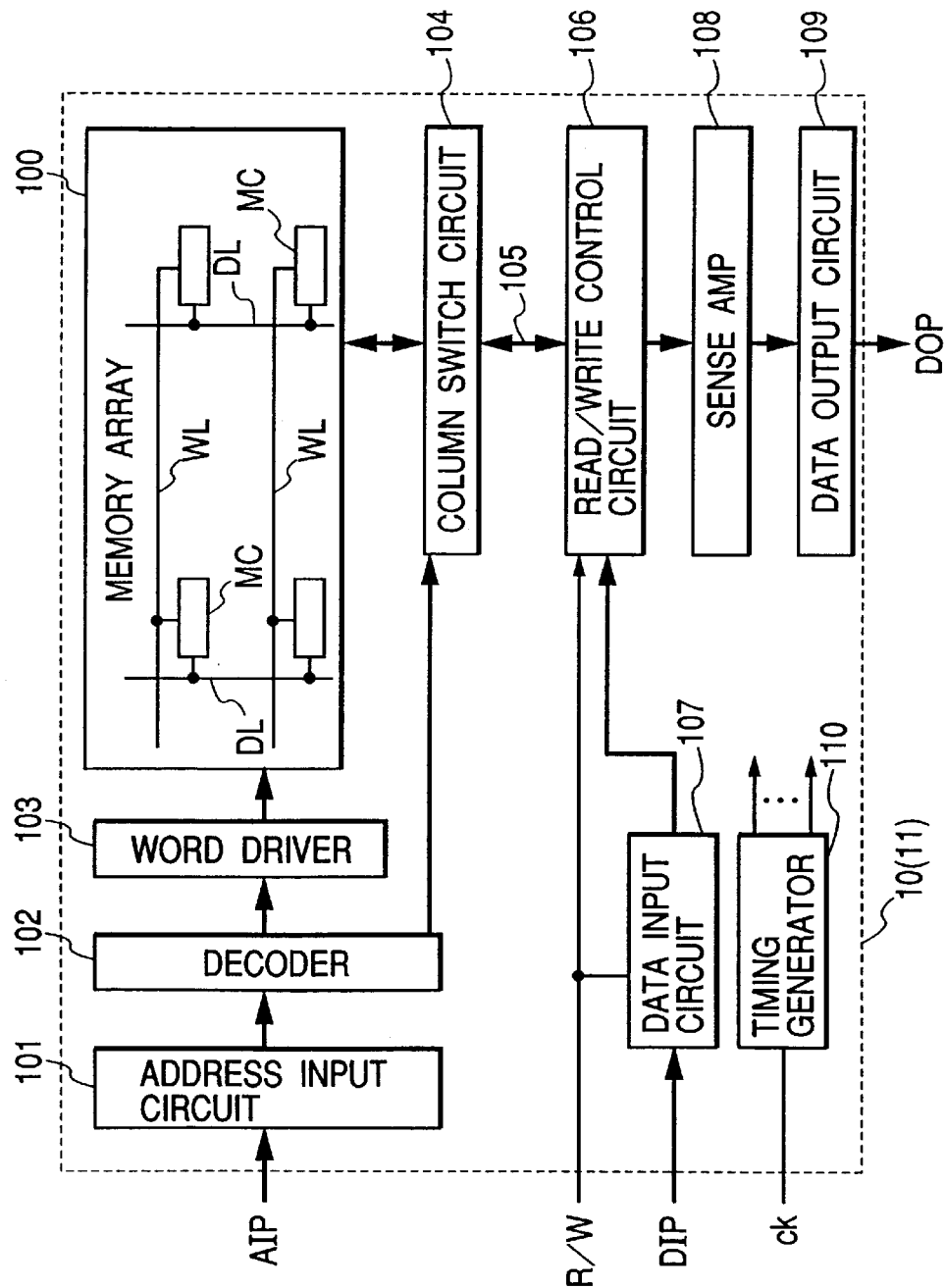
FIG. 3 is a block diagram depicting one example of a RAM used in the multiport memory shown in FIG. 1.

FIG. 3 shows one example of each of the RAMs 10 and 11, A memory array 100 is constructed such that readable and writable memory cells MCs are arranged in matrix form, selection terminals of the memory cells MC are respectively connected to word lines WL of their corresponding rows, and data input/output terminals thereof are respectively connected to bit lines BL of their corresponding columns. The bit lines BL are actually complementary signal lines. An address signal for selecting the corresponding memory cell MC is supplied to an address input circuit 101 through an address input terminal group AIP. This is decoded by a decoder 102 so that a word line select signal and a data line select signal are produced. The word line select signal is supplied to a word driver 103 so that a word line to be selected is driven into a selection level by the word line select signal. The data line select signal is supplied to a column switch circuit 104 so as to conduct a data line to be selected thereby over a common data line 105. The common data line 105 is coupled to a read/write control circuit 106. The read/write control circuit 106 selects either the reading of data from the corresponding memory cell MC conducted on the common data line 105 or writing of data therein. This operation is specified by a read/write signal R/W. Externally-inputted write data is supplied to a data input circuit 107 through a data input terminal group DIP and thereafter supplied to the read/write control circuit 106 with predetermined timing. Data read into the common data line 105 from the corresponding memory cell MC is supplied to a sense amplifier 108 through the read/write control circuit 106 with predetermined timing, whereby the amplified read data is outputted from a data output circuit 109 provided at a stage subsequent to the sense amplifier 108 to a data output terminal group DOP with predetermined timing. Reference numeral 110 indicates a timing generator of the RAM 10 (11), which generates internal various operating timing signals in synchronism with a clock signal ck. The clock signal is used as an enable clock signal for the RAM 10 (11), which, for example, activates control of an internal operation of one memory in synchronism with a change in the rising edge of the enable clock signal.

Figure 4:
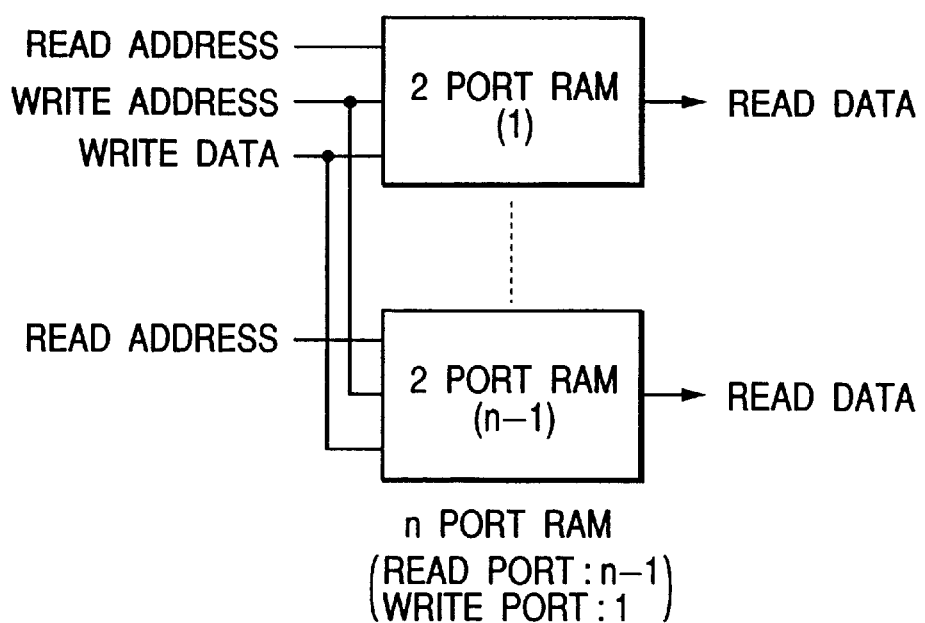
FIG. 4 is a block diagram showing a multiport RAM according to a comparative example constructed of two two-port RAMs.

The multiport memory 1 can obtain the following operation and effects. That is, a multiport RAM having four ports apparently can be implemented using the two single-port RAMs 10 and 11. In other words, the two RAMs 10 and 11 are serially activated to set the number of ports as four apparently. It is unnecessary to adopt a configuration (shown in a comparative example in FIG. 4) of parallel operation of the four two-port RAMs for implementation of the same function as described above. Thus, the number of RAMs to be operated in parallel can be reduced, thereby making it possible to contribute to low power consumption as compared with the prior art.

Figure 5:
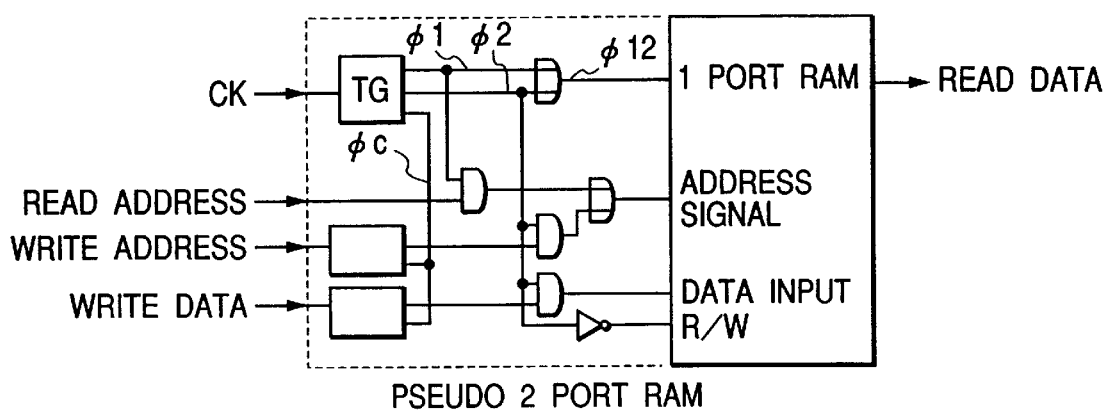
FIG. 5 is a block diagram illustrating a multiport RAM according to another comparative example constructed on a pseudo basis by using a parallel/serial converter in a single-port RAM.
Figure 6:
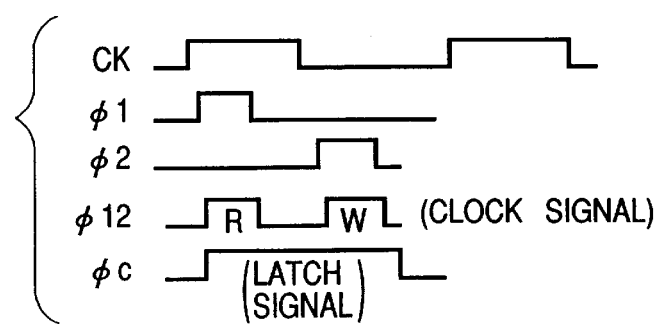
FIG. 6 is a timing chart depicting one example of operating timing of the multiport RAM shown in FIG. 5.

Further, since a plurality of RAMs are used, the individual RAMs can be substantially accessed in parallel as regards a read access even when each individual RAMs are given in the form of a single port, whereby a delay in apparent parallel read access to be executed from the outside can be improved. A two-port RAM constructed on a pseudo basis by using a parallel/serial converter in a signal port RAM is shown in FIG. 5 as a comparative example. FIG. 6 shows its operating timing. A four-port RAM can be also implemented on a pseudo basis if the parallel/serial converter is changed. Even in this case, however, all the access operations including a read operation are inevitably brought into serial form. In the configuration of the comparative example in FIG. 5, the more the number of pseudo multiport or multiple ports increases, the more the read access is inevitably delayed.

The RAMs 10 and 11 need to precharge a bit line level to a predetermined level before the start of the read operation. At this time, the logic circuit 15 takes such a logic configuration as to cause the read operation for each of the RAMs 10 and 11 to take precedence over the write operation during the cycle prescribed by the external clock signal CK. Upon the write operation, each bit line may be driven by the write amplifier and no precharge operation is required. When the write operation is done prior to the read operation, the precharge operation for each bit line must be performed before the read operation. Thus, if the read operation takes precedence over the write operation, then the apparent multiport access time interval during which the read operation and write operation are made continuous, can be shortened.

Although the multiport memory is formed in one semiconductor chip, the general purpose RAM chip is used for the RAMs 10 and 11 and the port expansion unit 12 may be comprised of the TTL circuit or the like. In such a case, the input buffers may not be provided in the input circuit 13 of the port expansion unit 12.

<<Second Multiport Memory>>

FIG. 7 shows a multiport memory as a second embodiment, which apparently functions as a four-port RAM using two two-port RAMs. The multiport memory 2 shown in the same drawing has two RAMs 20 and 21 and a port expansion unit 22 electrically connected to access ports of the respective RAMs 20 and 21.

The respective RAMs 20 and 21 have circuit configurations identical to each other and are so-called dual-port RAMs which incorporate therein memory cells each having data input/output terminals and selection terminals as two pairs. If each of the RAMs 20 and 21 is of SRAM, for example, then each memory cell can be constructed by providing two pairs of selection transistors with respect to an input/output node of the known static latch, for example.

Although not restricted in particular, each of the RAMs 20 and 21 has a dual port constructed by a write port and a read port. The write port has an address input terminal group AIPW for write access, a data input terminal group DIP, and a write enable signal input terminal WE. The read port has an address input terminal group AIPr for read access, a data output terminal group DOP, and a read enable signal input terminal RE. A clock (enable clock) input terminal is represented by ck. Each of the RAMs 20 and 21 starts an internal memory operation in synchronism with the rising edge of a clock input at the clock input terminal ck and allows the read and write ports to perform input and output operations in complete parallel.

The port expansion unit 22 has an input circuit 23 for allowing access control information AD and DI for activating the RAMs 20 and 21 in parallel every memory cycles to be collectively inputted thereto by a plurality of memory cycles, a timing generator (TG) 24 for generating internal clock signals $\phi 1$, $\phi 2$ and $\phi c$ capable of prescribing the memory cycles on a series basis plural times during one cycle of a clock signal CK supplied from the outside, and a logic circuit 25 capable of sequentially supplying the access control information of the input circuit 23 to the plurality of RAMs 20 and 21 in parallel in parts every serial memory cycles synchronized with each internal clock signal referred to above. While the multiport memory 1 is formed in a single semiconductor chip, although not restricted in particular, the RAMs 20 and 21 and the port expansion unit 22 can be formed into separate semiconductor chips.

The input circuit 23 has read address input circuits 230 and 231, write address input circuits 232 and 233 and write data input circuits 234 and 235 corresponding to numbers respectively equal to the number (=2) of the RAMs 20 and 21 (also called two-port RAMs 20 and 21). The number of address input bits for each of the respective address input circuits 230 through 233 is set equal to the numbers of bits for the address input terminal groups AIPw (AIPr) of the RAMs 20 and 21. Further, the numbers of bits for the write data input circuits 234 and 235 are also respectively set equal to the numbers of bits for the data input terminal groups DIP of the RAMs 20 and 21.

In the multiport memory 2 shown in FIG. 7, the read address input circuits 230 and 231 respectively constitute read access ports one by one together with the output terminal groups DOP of the RAMs 20 and 21, the write address input circuit 232 and the write data input circuit 234 constitute a single write access port, and the write address input circuit 233 and the write data input circuit 235 constitute another write access port, respectively. The multiport memory 2 apparently constitutes a RAM having four ports in total, which has two write ports and two read ports. FIG. 7 is different from FIG. 1 in that the RAMs 20 and 21 have complete dual ports respectively and are capable of completely making the read and write operation in parallel.

Although not restricted in particular, the read address input circuits 230 and 231 have unillustrated address input buffers respectively and are supplied with read addresses AD(Ra) and AD(Rb) through signal lines respectively. Although not restricted in particular, the write address input circuits 232 and 233 have unillustrated address input buffers respectively and are supplied with write addresses AD(Wc) and AD(Wd) through signal lines. A latch 236 for latching a write address therein is provided at a stage next to the unillustrated one address input buffer. Although not restricted in particular, the write data input circuits 234 and 235 have unillustrated data input buffers respectively and are supplied with write data DI(Wc) and DI(Wd) through signal lines respectively. A latch 238 for latching write data therein is provided at a stage next to the unillustrated one data input buffer. Since the memory 2 is constructed so that different read ports are respectively assigned to the two RAMs 20 and 21, the same data must be stored in both RAMs 20 and 21 at the same address to ensure or assure that the same data can be read even from either of the RAMs 20 and 21. Thus, when the operations for writing the same data into the two RAMs 20 and 21 are performed serially, the above-described latches 136 through 139 are provided to hold one of the two pairs of write addresses and write data supplied in parallel in advance till the commencement of the subsequent write operation.

Figure 8:
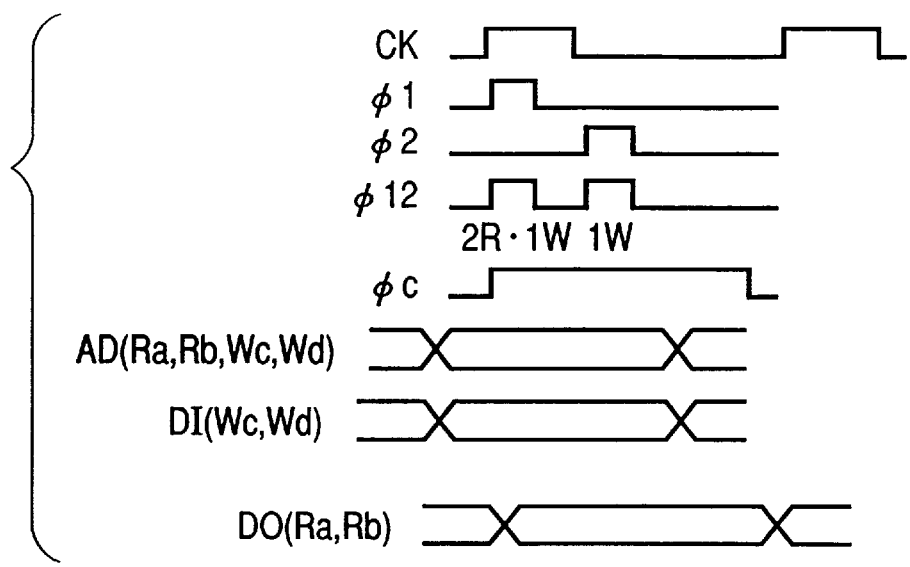
FIG. 8 is a timing chart showing timing provided to operate the multiport memory shown in FIG. 7.
Figure 9:
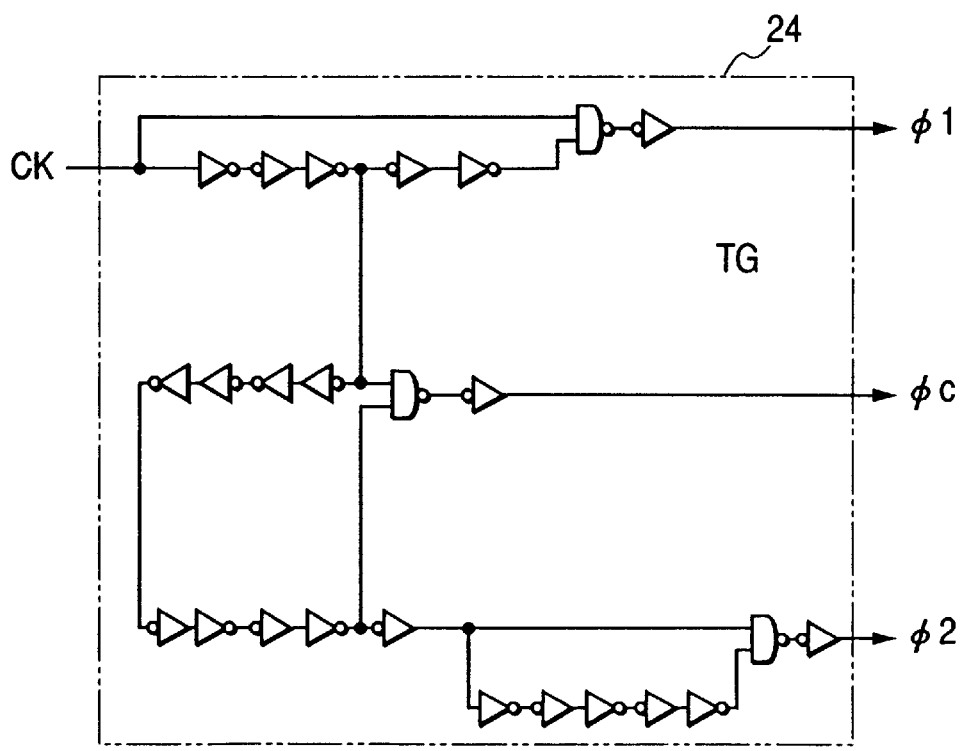
FIG. 9 is a logic circuit diagram depicting one example of a timing generator.

As shown in FIG. 8 by way of example, the timing generator 24 generates non-overlapped two-phase internal clock signals φ1 and φ2 during one cycle of the clock signal CK supplied from the outside and outputs a clock signal φc which rises in synchronism with the rising edge of the clock signal φ1 and falls in synchronism with the falling edge of the clock signal φ2. The clock signals φ1, φ2 and φc can be formed by setting a signal indicative of the negative logical product (logical product) of the clock signal CK and a delayed signal of the clock signal CK as a basis and allowing delay times to differ from each other. The latches 236 and 238 are respectively brought to a latched state during a high level of the clock signal φc. The latches 236 and 238 may be allowed to perform latch operations in synchronism with the rising edge of the clock signal φc. In this case, the clock signal φc can be replaced by φ1.

The logic circuit 25 serially generates the memory cycles of the RAMs 20 and 21 by two cycles in synchronism with the clock signals φ1 and φ2 from one cycle of the clock signal CK. Described specifically, an output φ12 of an OR gate 250 to which the clock signals φ1 and φ2 are inputted, is supplied to the clock input terminals ck as an enable clock signal for the RAMs 20 and 21. Thus, the RAMs 20 and 21 start memory cycles in synchronism with the rising edge of the signal φ12. Operating states of the RAMs 20 and 21 at that time are determined as follows: Whether or not the write operation for each RAM should be done, is determined according to the signal outputted from the OR gate 250, and whether or not the read operation for each RAM should be done, is determined according to the clock signal φ1. That is, instructions for a read access and a write access are given in a memory cycle synchronized with a high level of the signal φ1, and instructions for a write access are given in a memory cycle synchronized with a high level of the signal φ2. In the read access synchronized with the high level of the signal φ1, the read addresses AD(Ra) and AD(Rb) are inputted to the address input terminal groups AIP and AIP of the RAMs 20 and 21 through AND gates 252 and 253, so that data DO(Ra) and DO(Rb) are outputted in parallel. In the write access synchronized with the signal φ1, which is done in parallel to this, the write address AD(Wc) and write data DI(Wc) are supplied in parallel to the two RAMs 20 and 21 through AND gates 254 and 255 and OR gates 256 and 257, so that the same data is written therein. In the write access synchronized with the high level of the signal φ2, the write address AD(Wd) and the write data DI(Wd) are supplied in parallel to the two RAMs 20 and 21 through AND gates 258 and 259 and the OR gates 256 and 257, so that the same data is written therein.

FIG. 8 shows timing provided to operate the multiport memory 2. As is apparent from the above description, the initial memory cycle synchronized with the clock signal φ1 is a read access cycle and a first write access cycle performed in parallel to each other. The read access cycle is a read cycle parallel to the RAMs 20 and 21, based on the different read addresses AD(Ra) and AD(Rb). Thus, the separate data DO(Ra) and DO(Rb) are read in parallel from the RAMs 20 and 21. The first write access cycle is the same write cycle parallel to both RAMs 20 and 21, based on the write address AD(Wc). Thus, the same data DI(Wc) is written into both RAMs 20 and 21 at the same write address AD(Wc). A memory cycle synchronized with the clock signal φ2 is the same write cycle parallel to both RAMs 20 and 21, based on the write address AD(Wd). Thus, the same data DI(Wd) is written into both RAMs 20 and 21 at the same write address AD(Wd).

The multiport memory 2 can obtain the following operation and effects. The multiport memory 2 can implement a multiport RAM having four ports apparently using the two dual-port RAMs 20 and 21. Since it is unnecessary to adopt such a configuration as to activate four two-port RAMs in parallel, the number of RAMs to be operated in parallel can be reduced, thereby making it possible to contribute to low power consumption as compared with the prior art. Further, since a plurality of RAMs are used, the individual RAMs can be substantially accessed in parallel as regards the read access, whereby a delay in apparent parallel read access to be executed from the outside can be improved. Since each of the RAMs 20 and 21 allows the read operation to take precedence over the write operation, an apparent multiport access time interval during which the read and write operations are made continuous, can be shortened. Although the multiport memory is formed in one semiconductor chip, the general purpose RAM chip is used for the RAMs 20 and 21 and the port expansion unit 22 may be comprised of the TTL circuit or the like. In such a case, the input buffers may not be provided in the input circuit 23 of the port expansion unit 22.

<<Third Multiport Memory>>

FIG. 10 shows a multiport memory as a third embodiment, which apparently functions as a four-port RAM using two two-port RAMs. The present multiport memory is different from the multiport memory 2 in that read and write accesses to respective ports can be arbitrarily specified from the outside.

The multiport memory 3 shown in the same drawing has two RAMs 30 and 31 and a port expansion unit 32 electrically connected to access ports of the respective RAMs 30 and 31.

The respective RAMs 30 and 31 have circuit configurations identical to each other and are so-called dual-port RAMs which incorporate therein memory cells each having data input/output terminals and selection terminals as two pairs. If each of the RAMs 30 and 31 is of SRAM, for example, then each memory cell can be constructed by providing two pairs of selection transistors with respect to an input/output node of the known static latch, for example.

Although not restricted in particular, the RAMs 30 and 31 have ports capable of arbitrarily performing the read and write accesses, two by two respectively. The respective ports have address input terminal groups AIP, data input terminal groups DIP, data output terminal groups DOP, write enable terminals WE and read enable terminals RE as one units respectively. A clock (enable clock) input terminal is represented by ck. The RAMs 30 and 31 start internal memory operations in synchronism with the rising edge of a clock input at the clock input terminal ck and can activate the two access ports in complete parallel respectively.

The port expansion unit 32 has an input circuit 33 for allowing access control information AD, DI and R/W for activating the RAMs 30 and 31 in parallel every memory cycles to be collectively inputted thereto by a plurality of memory cycles, a timing generator (TG) 34 for generating internal clock signals $\phi 1$, $\phi 2$ and $\phi c$ capable of prescribing the memory cycles on a series basis plural times during one cycle of a clock signal CK supplied from the outside, and a logic circuit 35 capable of sequentially supplying the access control information of the input circuit 33 to the plurality of RAMs 30 and 31 in parallel in parts every serial memory cycles synchronized with each internal clock signal referred to above. While the multiport memory 1 is formed in one semiconductor chip, although not restricted in particular, the RAMs 30 and 31 and the port expansion unit 32 can be also formed into separate semiconductor chips.

The input circuit 33 has address input circuits 330A through 333A, write data input circuits 330D through 333D, and read/write signal input circuits 330C through 333C in association with the respective ports of the RAMs 30 and 31 (also called two-port RAMs 30 and 31). The numbers of address input bits for the respective address input circuits 330A through 333A are set equal to the numbers of bits for the address input terminal groups AIP of the RAMs 30 and 31 respectively. Further, the numbers of bits for the write data input circuits 330D through 333D are also respectively set equal to the numbers of bits for the data input terminal groups DIP of the RAMs 30 and 31.

In the multiport memory 3 shown in FIG. 10, the address input circuit 330A, the write data input circuit 330D, the read/write signal input circuit 330C and the data output terminal group DOP constitute a first port. The address input circuit 331A, the write data input circuit 331D, the read/write signal input circuit 331C and the data output terminal group DOP constitute a second port. The address input circuit 332A, the write data input circuit 332D, the read/write signal input circuit 332C and the data output terminal group DOP constitute a third port. The address input circuit 333A, the write data input circuit 333D, the read/write signal input circuit 333C and the data output terminal group DOP constitute a fourth port. Thus, the multiport memory 3 apparently constitute the four-port RAM having the four access ports capable of reading/writing.

Although not restricted in particular, the address input circuits 330A through 333A have unillustrated address input buffers respectively and are supplied with address signals AD(1) through AD(4) through signal lines respectively. Further, the address input circuits 330A through 333A have latches 330AL through 333AL for latching the supplied address signals therein, respectively. Although not restricted in particular, the write data input circuits 330D through 333D have unillustrated data input buffers respectively and are supplied with write data DI(1) through DI(4) through signal lines respectively. Further, the write data input circuits 330D through 333D have latches 330DL through 333DL for latching the supplied write data signals therein, respectively. Although not restricted in particular, the read/write signal input circuits 330C through 333C have unillustrated control signal input buffers respectively and are supplied with read/write signals R/W(1) through R/W(4) through signal lines respectively. Further, the read/write signal input circuits 330C through 333C have latches 330CL through 333CL for latching the supplied read/write signals therein, respectively. Since the memory 3 is constructed so that different read ports are respectively assigned to the two RAMs 30 and 31, the same data must be stored in both RAMs 30 and 31 at the same address to ensure or assure that the same data can be read even from either of the RAMs 30 and 31. Thus, when the operations for writing the same data into the two RAMs 30 and 31 are performed serially, the above-described latches 330AL through 333AL, 330DL through 333DL and 330CL through 333CL are provided to hold one of the two pairs of write addresses and write data or the like supplied in parallel in advance till the commencement of the subsequent write operation.

Figure 11:
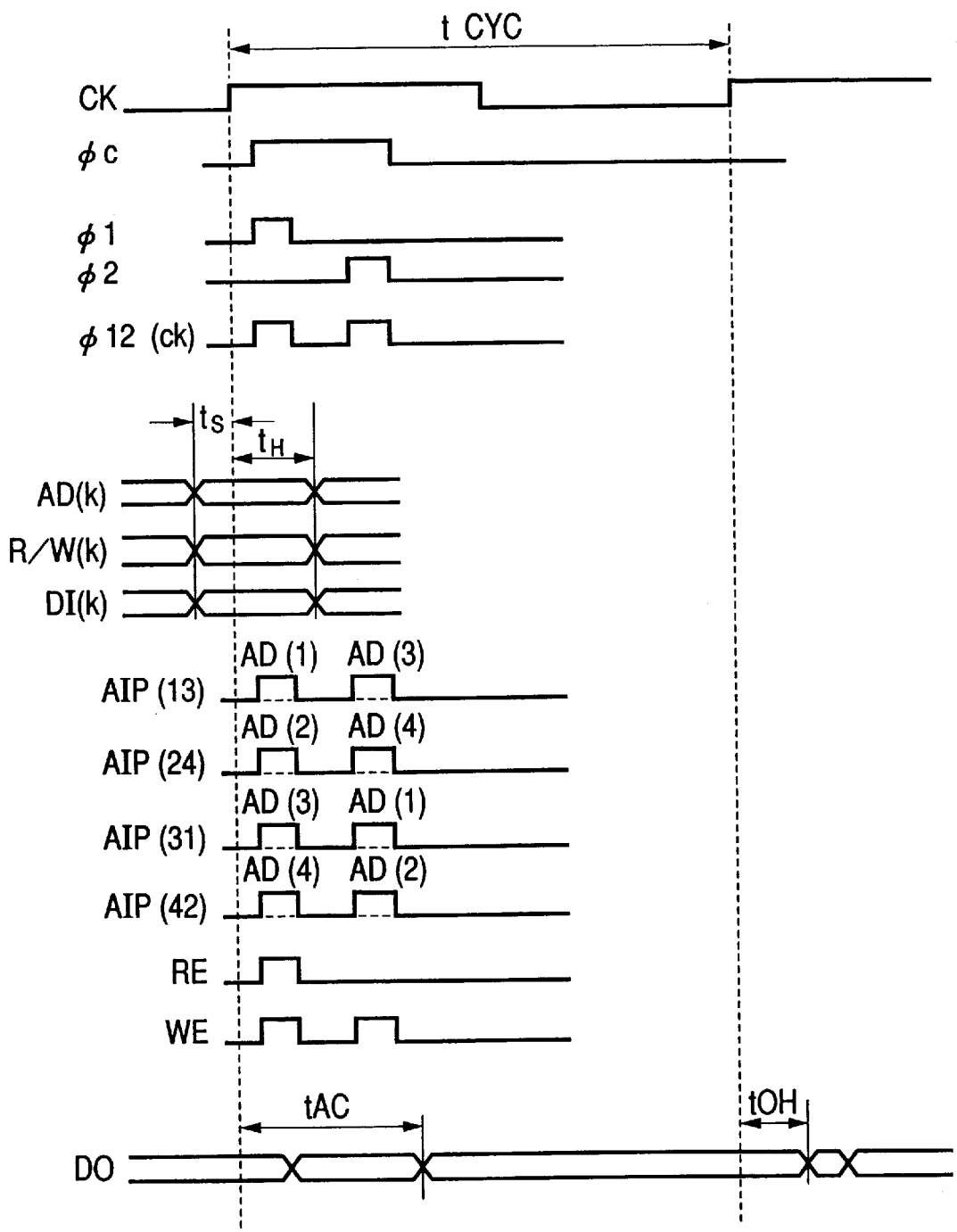
FIG. 11 is a timing chart depicting timing provided to operate the multiport memory shown in FIG. 10.

As shown in FIG. 11 by way of example, the timing generator 34 generates non-overlapped two-phase internal clock signals $\phi 1$ and $\phi 2$ during one cycle of the clock signal CK supplied from the outside and outputs a clock signal $\phi c$ which rises in synchronism with the rising edge of the clock signal $\phi 1$ and falls in synchronism with the falling edge of the clock signal $\phi 2$. The clock signals $\phi 1$, $\phi 2$ and $\phi c$ can be formed by setting a signal indicative of the negative logical product (logical product) of the clock signal CK and a delayed signal of the clock signal CK as a base and allowing delay times to differ from each other. The latches 330AL through 333AL, 330DL through 333DL and 330CL through 333CL are respectively brought to a latched state during a high level of the clock signal $\phi c$. The latches 330AL through 333AL, 330DL through 333DL and 330CL through 333CL may be latched in synchronism with the rising edge of the clock signal $\phi c$. In this case, the clock signal $\phi c$ can be replaced by $\phi 1$.

The logic circuit 35 serially generates the memory cycles of the RAMs 30 and 31 by two cycles in synchronism with the clock signals $\phi 1$ and $\phi 2$ from one cycle of the clock signal CK. Described specifically, an output $\phi 12$ of an OR gate 350 to which the clock signals $\phi 1$ and $\phi 2$ are inputted, is supplied to the clock input terminals ck as an enable clock signal for the RAMs 30 and 31. Thus, the RAMs 30 and 31 start memory cycles in synchronism with the rising edge of the signal $\phi 12$.

Operating states of the RAMs 30 and 31 at that time are represented as shown in FIG. 11. That is, a read cycle (indicated by RE="1") for each of the RAMs 30 and 31 can be selected by the first-half memory cycle synchronized with the clock signal φ1, whereas a write cycle (indicated by WE ="1") can be selected by both memory cycles of the clock signals φ1 and φ2. Whether or not it is actually selected, is controlled by the signals R/W(1) through R/W(4). The parallel-supplied address signals AD(1) through AD(4) are supplied to the access ports of the two RAMs 30 and 31 as follows: In the memory cycle synchronized with the clock signal φ1, the two ports of the RAM 30 are assigned AD(1) and AD(2), whereas the two ports of the RAM 31 are assigned AD(3) and AD(4). In the memory cycle synchronized with the clock signal φ2, AD(3) and AD(4) are supplied to the two ports of the RAM 30, and AD(1) and AD(2) are supplied to the two ports of the RAM 31. Thus, when the read operation is given to all the four ports by the signals R/W1 through R/W4, the separate address signals AD(1) through AD(4) are supplied to the respective ports of the RAMs 30 and 31 in the memory cycle synchronized with the clock signal φ1 as illustrated in FIG. 11 by way of example, so that desired read data are outputted in parallel from the ports of the RAMs 30 and 31, corresponding to four in total. Since the same data must be held at the same address for both the RAMs 30 and 31 upon write access, the address signals and write data supplied to the RAMs 30 and 31 in the memory cycle synchronized with the clock signal φ1 are inevitably supplied to the RAMs 31 and 30 different from the above in the memory cycle synchronized with the clock signal φ2. When the write access to the address signals AD(1) and AD(2) is given, for example, the address signals AD(1) and AD(2) and the write data DI(1) and DI(2) are supplied to the RAM 30 in the memory cycle synchronized with the clock signal φ1, whereas the address signals AD(1) and AD(2) and the write data DI(1) and DI(2) are supplied to the RAM 31 in the memory cycle synchronized with the clock signal φ2, whereby the same data are written at the same addresses for both the RAMs 31 and 30.

FIG. 11 shows timing provided to operate the multiport memory 3. As is apparent from the above description, four-port independent read operations are effected in parallel on the RAMs 30 and 31 in the memory cycle synchronized with the clock signal φ1 when instructions for the read operation are given to all the address signals AD(1) through AD(4).

When the instructions for the read operation are given to the address signal AD(1) and instructions for the write operation are given to the address signals AD(2) through AD(4), the read operation based on the address signal AD(1) is effected on one port of the RAM 30 and the write operation based on the address signal AD(2) is performed on the other port of the RAM 30 in the memory cycle synchronized with the clock signals φ1. Further, the writing operations based on the address signals AD(3) and AD(4) are effected on both ports of the RAM 31 in parallel. In a memory cycle synchronized with the next clock signal φ2, the write operations based on the address signals AD(3) and AD(4) are performed on both ports of the RAM 30 in parallel and the write operation based on the address signal AD(2) is effected on one port of the RAM 31.

When the instructions for the read operation are given to the address signals AD(1) and AD(2) and the instructions for the write operation are given to the address signals AD(3) and AD(4), the read operations based on the address signals AD(1) and AD(2) are performed on both ports of the RAM 30 and the write operations based on the address signals AD(3) and AD(4) are effected on both ports of the RAM 31 in parallel in the memory cycle synchronized with the clock signal φ1. In the memory cycle synchronized with the next clock signal φ2, the write operations based on the address signals AD(3) and AD(4) are performed on both ports of the RAM 30 in parallel and no access to the RAM 31 is performed.

Figure 12:
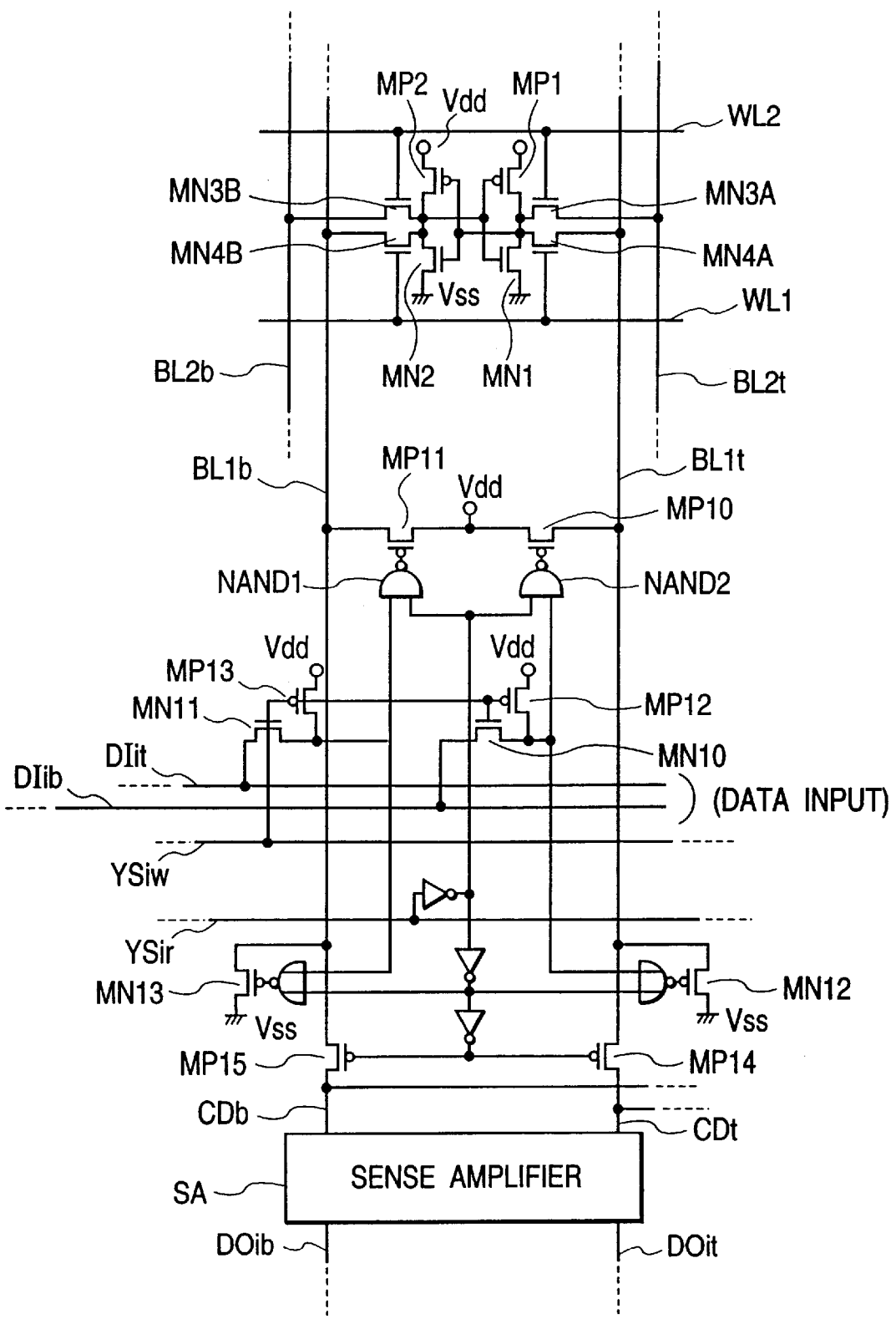
FIG. 12 is a circuit diagram showing one example illustrative of a memory cell and a column-system circuit in a RAM.

FIG. 12 shows one example illustrative of a memory cell and a column-system circuit in the RAM 30. The memory cell has a static latch comprised of p channel MOS transistors MP1 and MP2 and n channel MOS transistors MN1 and MN2. Input/output nodes (storage nodes) of the static latch are respectively electrically connected to complementary bit lines BL1t and BL1b through n channel selection MOS transistors MN3A and MN3B and electrically connected to complementary bit lines BL2t and BL2b through n channel selection MOS transistors MN4A and MN4B. The gates of the MOS transistors MN3A and MN3B are electrically connected to a word line WL2 and the gates of the MOS transistors MN4A and MN4B are electrically connected to a word line WL1.

The complementary bit lines BL1t and BL1b are respectively electrically connected to common data lines CDt and CDb through typically-illustrated p channel column switch MOS transistors MP14 and MP15. The common data lines CDt and CDb are electrically connected to a sense amplifier SA so that outputs DOit and DOib of the sense amplifier SA can be outputted to the outside. The column switch MOS transistors MP14 and MP15 are by-switching controlled by a column read select signal YSir corresponding to one decode signal outputted from an unillustrated column address decoder.

p channel MOS transistors MP10 and MP11 are utilized even for bit-line precharge and data writing. DIit and DIib are respectively complementary write signal lines through which write data is transferred. The outputs of NAND gates NAND1 and NAND2 are respectively electrically coupled to the gates of the MOS transistors MP10 and MP11. One input terminals of the NAND gates NAND1 and NAND2 are respectively supplied with an inverted signal of the column read select signal YSir. Further, p channel MOS transistors MP12 and MP13 turned on in a column write non-selected state (YSiw=low level) are respectively electrically connected to the other input terminals of the NAND gates NAND1 and NAND2. Thus, the MOS transistors MP10 and MP11 are turned on in a column read non-selected state (YSir=low level) and the column write non-selected state, so that the bit lines BL1t and BL1b are precharged.

When the column read selected state in a read access, i.e., the column read select signal YSir is brought to a selected level (YSir=high level), the precharge operation is stopped.

When a column write selected state in a write access, i.e., a column write select signal YSiw is brought to the selected level (YSir=high level), the pull-up MOS transistors MP12 and MP13 are cut off. Further, either the MOS transistors MN10 or MN11 is turned on and either the MOS transistors MN12 or MN13 is turned on, according to the states of complementary signals on the write signal lines DIt and DIib. When either the MOS transistors MP10 or MP11 is turned on, one bit line is driven toward a source voltage Vdd. On the other hand, when either the MOS transistors MN12 or MN13 is turned on, the other bit line is driven toward a ground voltage Vss. Thus, the complementary bit lines BLt and BLb are driven according to the write data.

Figure 13:
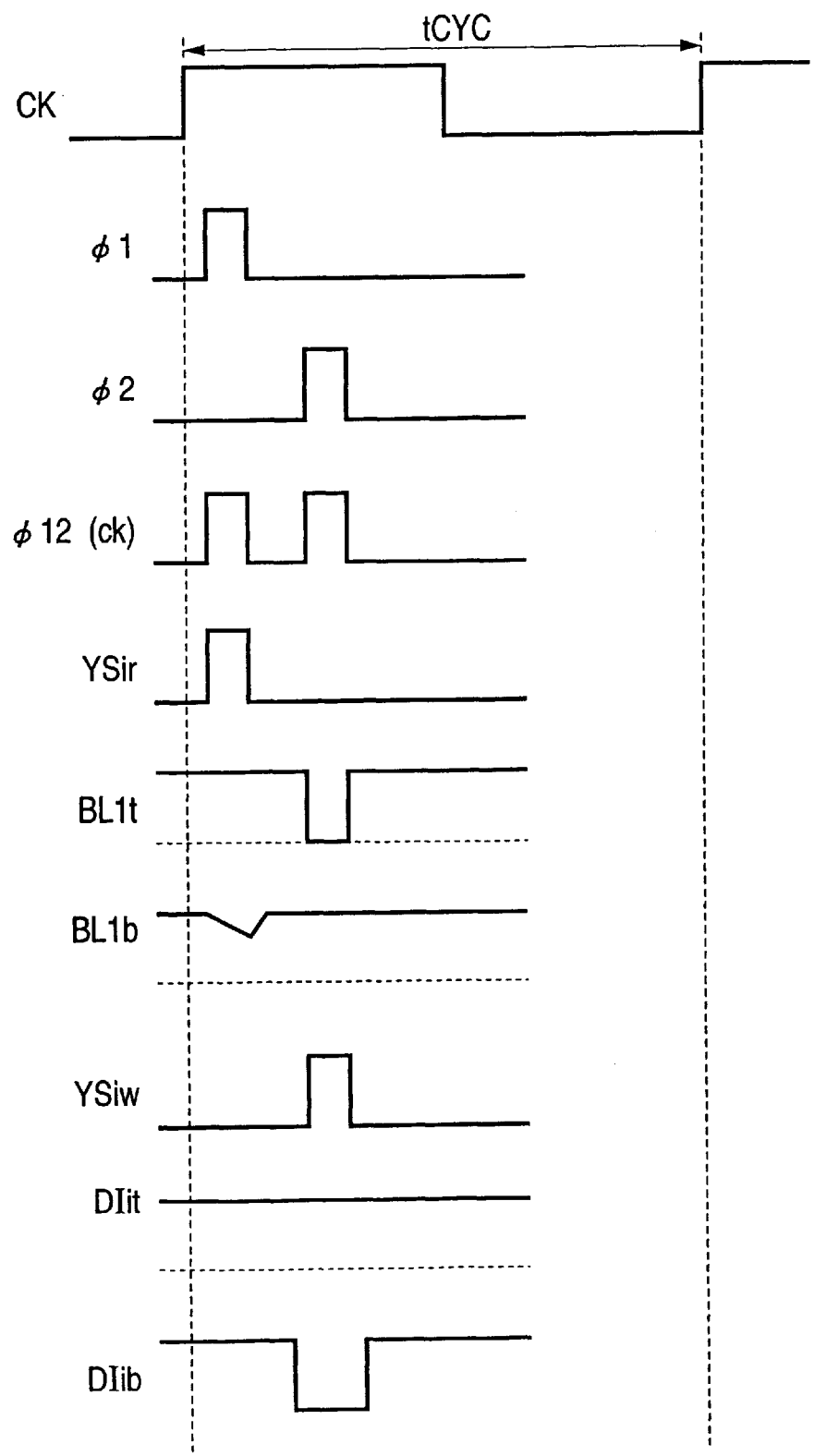
FIG. 13 is a timing chart illustrating one example of operating timing provided to execute a read access and a write access in the circuit shown in FIG. 12.

FIG. 13 shows one example of operating timing for the read and write accesses executed in the circuit shown in FIG. 12. The RAMs 30 and 31 need to precharge a bit line level to a predetermined level before the start of the read operation. At this time, the logic circuit 35 takes such a logic configuration as to cause the read operation for each of the RAMs 30 and 31 to take precedence over the write operation during the cycle prescribed by the external clock signal CK. Upon the write operation, each bit line may be driven by the write amplifier and no precharge operation is required. When the write operation is done prior to the read operation, the precharge operation for each bit line must be performed before the read operation. Thus, if the read operation takes precedence over the write operation, then an interval time between the read operation and the write operation can be minimized.

The multiport memory 3 can obtain the following operation and effects. The multiport memory 3 can implement a multiport RAM having four ports apparently using the two dual-port RAMs 30 and 31. Since it is unnecessary to adopt such a configuration as to activate four two-port RAMs in parallel, the number of RAMs to be operated in parallel can be reduced, thereby making it possible to contribute to low power consumption as compared with the prior art. Further, since a plurality of RAMs are used, the individual RAMs can be substantially accessed in parallel as regards the read access, whereby a delay in apparent parallel read access to be executed from the outside can be improved. Since each of the RAMs 30 and 31 allows the read operation to take precedence over the write operation, an apparent multiport access time interval during which the read and write operations are made continuous, can be shortened. Although the multiport memory is formed in one semiconductor chip, a general purpose RAM chip is used for the RAMs 30 and 31 and the port expansion unit 32 may be comprised of a TTL circuit or the like. In such a case, the input buffers may not be provided in the input circuit 33 of the port expansion unit 32.

<<Fourth multiport memory>>

FIG. 14 shows a multiport memory as a four embodiment, which apparently functions as an eight-port RAM using two two-port RAMs.

The multiport memory 4 shown in the same drawing has two RAMs 40 and 41 and a port expansion unit 42 electrically connected to access ports of the respective RAMs 40 and 41.

The respective RAMs 40 and 41 have circuit configurations identical to each other and are so-called dual-port RAMs which incorporate therein memory cells each having data input/output terminals and selection terminals as two pairs. If each of the RAMs 40 and 41 is of SPAM, for example, then each memory cell can be constructed by providing two pairs of selection transistors with respect to an input/output node of the known static latch, for example. A specific circuit configuration can be set identical to that shown in FIG. 12.

Although not restricted in particular, the RAMs 40 and 41 have ports PORT1 and PORT2 capable of arbitrarily performing read and write accesses, respectively. The respective ports PORT1 and PORT2 have address input terminal groups AIP, data input terminal groups DIP, data output terminal groups DOP, and read/write terminals R/W as one units respectively. A clock (enable clock) input terminal is represented by ck. The RAMs 40 and 41 start internal memory operations in synchronism with the rising edge of a clock input at the clock input terminal ck and can activate the two access ports PORT1 and PORT2 in complete parallel respectively.

The port expansion unit 42 has an input circuit 43 for allowing access control information AD and DI for activating the RAMs 40 and 41 in parallel every memory cycles to be collectively inputted thereto by a plurality of memory cycles, a timing generator (TG) 44 for generating internal clock signals $\phi1$, $\phi2$, $\phi3$ and $\phi c$ capable of prescribing the memory cycles on a series basis plural times during one cycle of a clock signal CK supplied from the outside, and a logic circuit 45 capable of sequentially supplying the access control information of the input circuit 43 to the plurality of RAMs 40 and 41 in parallel in parts every serial memory cycles synchronized with each internal clock signal referred to above. While the multiport memory 4 is formed in one semiconductor chip, although not restricted in particular, the RAMs 40 and 41 and the port expansion unit 42 can be also formed into separate semiconductor chips.

The input circuit 43 has read address input circuits 430R through 433R, write address input circuits 430W through 433W, and write data input circuits 430D through 433D four by four corresponding to twice the number of the ports of the RAMs 40 and 41 (also called two-port RAMs 40 and 41). The numbers of address input bits for the respective address input circuits 430R through 433R and 430W through 433W are set equal to the numbers of bits for the address input terminal groups AIP of the RAMs 40 and 41 respectively. Further, the numbers of bits for the write data input circuits 430D through 433D are also respectively set equal to the numbers of bits for the data input terminal groups DIP of the RAMs 40 and 41.

The multiport memory 4 shown in FIG. 14 has read ports corresponding to four in total, each comprising one of the read address input circuits 430R through 433R and one data output terminal group DOP. Further, the multiport memory 4 has write ports corresponding to four in total, each comprising one of the write address input circuits 430W through 433W and one of the write data input circuits 430D through 433D. Thus, the multiport memory 4 apparently constitutes a 8-port RAM having the four read ports and the four write ports.

Although not restricted in particular, the read address input circuits 430R through 433R have unillustrated address input buffers respectively and are supplied with address signals AD(R1) through AD(R4) through signal lines respectively. Although not restricted in particular, the write address input circuits 430W through 433W have unillustrated address input buffers respectively and are supplied with write address signals AD(W1) through AD(W4) through signal lines respectively. Further, the write address input circuits 430W through 433W have latches 430WL through 433WL for latching the supplied write address signals therein, respectively. Although not restricted in particular, the write data input circuits 430D through 433D have unillustrated data input buffers respectively and are supplied with write data DI(W1) through DI(W4) through signal lines respectively. Further, the write data input circuits 430D through 433D have latches 430DL through 433DL for latching the supplied write data signals therein, respectively. Since the memory 4 is constructed so that the different read ports are respectively assigned to the two RAMs 40 and 41, the same data must be stored in both RAMs 40 and 41 at the same address to ensure or assure that the same data can be read even from either of the RAMs 40 and 41. Thus, when the operations for writing the same data into the two RAMs 40 and 41 are performed serially, the above-described latches 430AL through 433AL and 430DL through 433DL are provided to hold the four pairs of write addresses AD(W1) through AD(W4) and write data DI(W1) through DI(W4) supplied in parallel in advance till the commencement of the subsequent write operation.

Figures 15, 16:
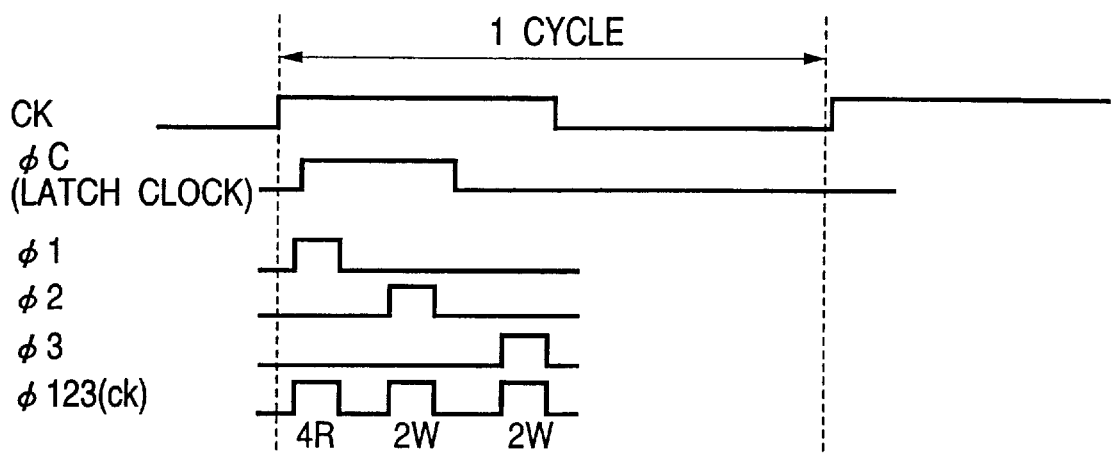
FIG. 15 is a timing chart depicting timing provided to operate the multiport memory shown in FIG. 14.
FIG. 16 is an operation illustration showing input/output states of respective ports of RAMs in respective memory cycles synchronized with φ1 through φ3 of the multiport memory shown in FIG. 15.

As shown in FIG. 15 by way of example, the timing generator 44 generates non-overlapped three-phase internal clock signals φ1, φ2 and φ3 during one cycle of the clock signal CK supplied from the outside and outputs a clock signal φc which rises in synchronism with the rising edge of the clock signal φ1 and falls in synchronism with the falling edge of the clock signal φ3. The clock signals φ1, φ2, φ3 and φc can be formed by setting a signal indicative of the negative logical product (logical product) of the clock signal CK and a delayed signal of the clock signal CK as a base and allowing delay times to differ from each other. The latches 430WL through 433WL and 430DL through 433DL are respectively brought to a latched state during a high level of the clock signal φc. The latches 430WL through 433WL and 430DL through 433DL may be latched in synchronism with the rising edge of the clock signal φc. In this case, the clock signal φc can be replaced by φ1.

The logic circuit 45 serially generates the memory cycles of the RAMs 40 and 41 by three cycles in synchronism with the clock signals φ1, φ2 and φ3 from one cycle of the clock signal CK. Described specifically, an output clock signal φ123 of an OR gate 450 to which the clock signals φ1, φ2 and φ3 are inputted, is supplied to the clock input terminals ck as an enable clock signal for the RAMs 40 and 41. Thus, the RAMs 40 and 41 start memory cycles in synchronism with the rising edge of the signal φ123. Operating states of the RAMs 40 and 41 at that time are determined according to a signal outputted from an OR gate 451. That is, since the OR gate 451 is supplied with inverted signals of the clock signals φ2 and φ3, the OR gate 451 provides instructions for a read access in a memory cycle synchronized with a high level of the clock signal φ1 and provides instructions for a write access in a memory cycle synchronized with high levels of the clock signals φ2 and φ3.

In the RAM 40, read addresses AD(R1) and AD(R2) are inputted to the address input terminal groups AIP and AIP of the RAM 40 through AND gates 452 and 453 and OR gates 454 and 455 in the read access synchronized with the high level of the clock signal φ1 so that data DO(R1) and DO(R2) are outputted in parallel. In the RAM 41 in a manner similar to the above, read addresses AD(R3) and AD(R4) are inputted to the address input terminal groups AIP and AIP of the RAM 41 through AND gates 456 and 457 and OR gates 458 and 459 in the read access synchronized with the high level of the clock signal φ1 so that data DO(R3) and DO(R4) are outputted in parallel.

In the write access synchronized with the high level of the clock signal φ2, the respective ports PORT1 of the RAMs 40 and 41 are respectively supplied with the write address AD(W1) and the write data DI(W1) from the latches 430WL and 430DL through AND gates 460 and 461, the OR gates 454 and 458 and OR gates 464 and 470, whereas the respective ports PORT2 of the RAMs 40 and 41 are respectively supplied with the write addresses AD(W2) and write data DI(W2) from the latches 431WL and 431DL through AND gates 462 and 463, the OR gates 455 and 459 and OR gates 465 and 471. Thus, both the data DI(W1) and DI(W2) are written into the RAMs 40 and 41 in parallel.

In the write access synchronized with the high level of the clock signal φ3, the respective ports PORT1 of the RAMs 40 and 41 are respectively supplied with the write address AD(W3) and write data DI(W3) from the latches 432WL and 432DL through AND gates 466 and 467 and the OR gates 454, 458, 464 and 470, whereas the respective ports PORT2 of the RAMs 40 and 41 are respectively supplied with the write address AD(W4) and write data DI(w4) from the latches 433WL and 433DL through AND gates 468 and 469 and the OR gates 455, 459, 465 and 471, whereby both the data DI(W3) and DI(W4) are written into the RAMs 40 and 41 in parallel.

FIG. 15 shows timing provided to operate the multiport memory 4. FIG. 16 illustrates input/output states of the respective ports of the RAMs 40 and 41 in the respective memory cycles synchronized with the signals φ1 through φ3. As is apparent from the above description, the initial memory cycle synchronized with the clock signal φ1 is a read cycle performed in parallel to the four ports of the RAMs 40 and 41, based on the different read addresses AD(R1) through AD(R4). According to it, the separate data DO(R1) through DO(R4) are read in parallel from the RAMs 40 and 41. The next memory cycle synchronized with the clock signal φ2 is defined as a write cycle performed in parallel to the two ports PORT1 and PORT2 of the RAMS 40 and 41 according to the data DI(W1) and DI(W2) based on the addresses AD(W1) and AD(W2). Thus, the same data DI(W1) and DI(W2) are respectively written into the same write addresses AD(W1) and AD(W2) of the RAMs 40 and 41. The next memory cycle synchronized with the clock signal φ3 is defined as a write cycle performed in parallel to the two ports PORT1 and PORT2 of the RAMs 40 and 41 according to the data DI(W3) and DI(W4) based on the addresses AD(W3) and AD(W4). Thus, the same data DI(W3) and DI(W4) are respectively written into the same write addresses AD(W3) and AD(W4) of the RAMs 40 and 41.

The multiport memory 4 can obtain the following operation and effects. The multiport memory 4 can implement a multiport RAM having eight ports apparently using the two dual-port RAMs 40 and 41. Since it is unnecessary to adopt such a configuration as to activate four two-port RAMs in parallel, the number of RAMs to be operated in parallel can be reduced, thereby making it possible to contribute to low power consumption as compared with the prior art. Further, since a plurality of RAMs are used, the individual RAMs can be substantially accessed in parallel as regards the read access, whereby a delay in apparent parallel read access to be executed from the outside can be improved. Since each of the RAMs 40 and 41 allows the read operation to take precedence over the write operation, an apparent multiport access time interval during which the read and write operations are made continuous, can be shortened. Although the multiport memory is formed in one semiconductor chip, a general purpose RAM chip is used for the RAMs 40 and 41 and the port expansion unit 42 may be comprised of a TTL circuit or the like. In such a case, the input buffers may not be provided in the input circuit 43 of the port expansion unit 42.

<<Data processor>>

Figure 17:
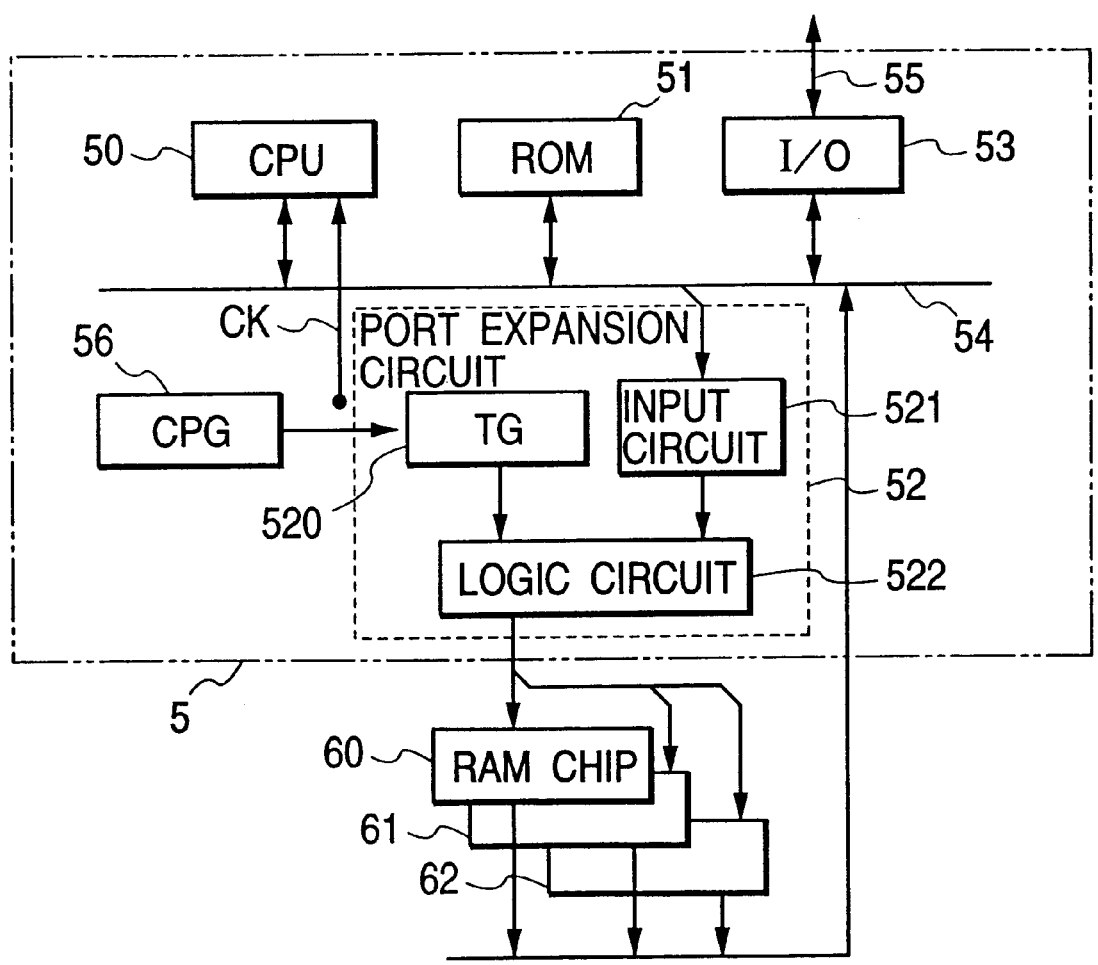
FIG. 17 is a block diagram showing one embodiment of a data processor.

FIG. 17 shows one example of a data processor. Although not restricted in particular, the data processor 5 shown in the same drawing comprises a port expansion circuit 52, a ROM 51, other input/output circuit (I/O) 53, and a clock pulse generator (CPG) 56, etc. together with a CPU 50, all of which are provided on a semiconductor chip. Designated at numeral 54 is an internal bus used for addresses, data and control signals or the like. Designated at numeral 55 is an external bus used for addresses, data and control signals or the like.

The port expansion circuit 52 has a circuit configuration similar to the port expansion circuits 15, 25, 35 and 45. That is, the port expansion circuit 52 is electrically connected to the CPU 50 through the bus 54 and electrically connected to access ports of a plurality of externally-provided RAM chips 60 through 62 to allow the plurality of RAM chips 60 through 62 to be accessed as a single multiport memory apparently. The port expansion circuit 52 has an input circuit 52 for allowing access control information for activating the plurality of RAM chips 60 through 62 in parallel every memory cycles to be collectively inputted thereto by a plurality of memory cycles, a timing generator (TG) 520 for generating the control clock signals φ1, φ2, etc. capable of prescribing the memory cycles on a series basis plural times during one cycle of a synchronizing clock signal CK of the data processor 5, and a logic circuit 522 capable of sequentially supplying the access control information of the input circuit 521 to the plurality of RAM chips 60 through 62 in parallel in parts every serial memory cycles synchronized with the control clock signals φ1, φ2, etc. The synchronizing clock signal CK is outputted from the CPG 56 comprised of a PLL or the like.

The data processor 5 is placed on a circuit board like an unillustrated packing board. Likewise, the plurality of RAM chips 60 through 62 mounted to the circuit board are electrically connected to the port expansion circuit 52 and access-controlled by the data processor 5. If the data processor 5 provided with the port expansion circuit 52 as an external interface circuit is used, then a multiport memory provided with a required number of read ports apparently can be easily implemented using a single port or dual port general-purpose RAM chip such as DRAM or SDRAM or the like. The multiport memory implemented in this way functionally exhibits the same function as the above-described multiport memories 1, 2, 3 and 4. Further, a data processing system using a multiport memory can be reduced in the amount of power consumption.

The data processor may be constructed by placing the RAM chips 60 through 62 on a semiconductor chip. At this time, the RAM chips 60 through 62 are formed on a common semiconductor chip by using mask patterns substantially identical thereto, in other words, the same layout-pattern design data library.

The circuit in which the RAM chips are placed on the semiconductor chip with respect to the configuration shown in FIG. 17, is not necessarily limited to the data processor. This circuit can be also applied to a semiconductor integrated circuit such as a controller for communication control or protocol control, which is provided with a multiport RAM as a data buffer.

<<Data Processing System>>

Figure 18:
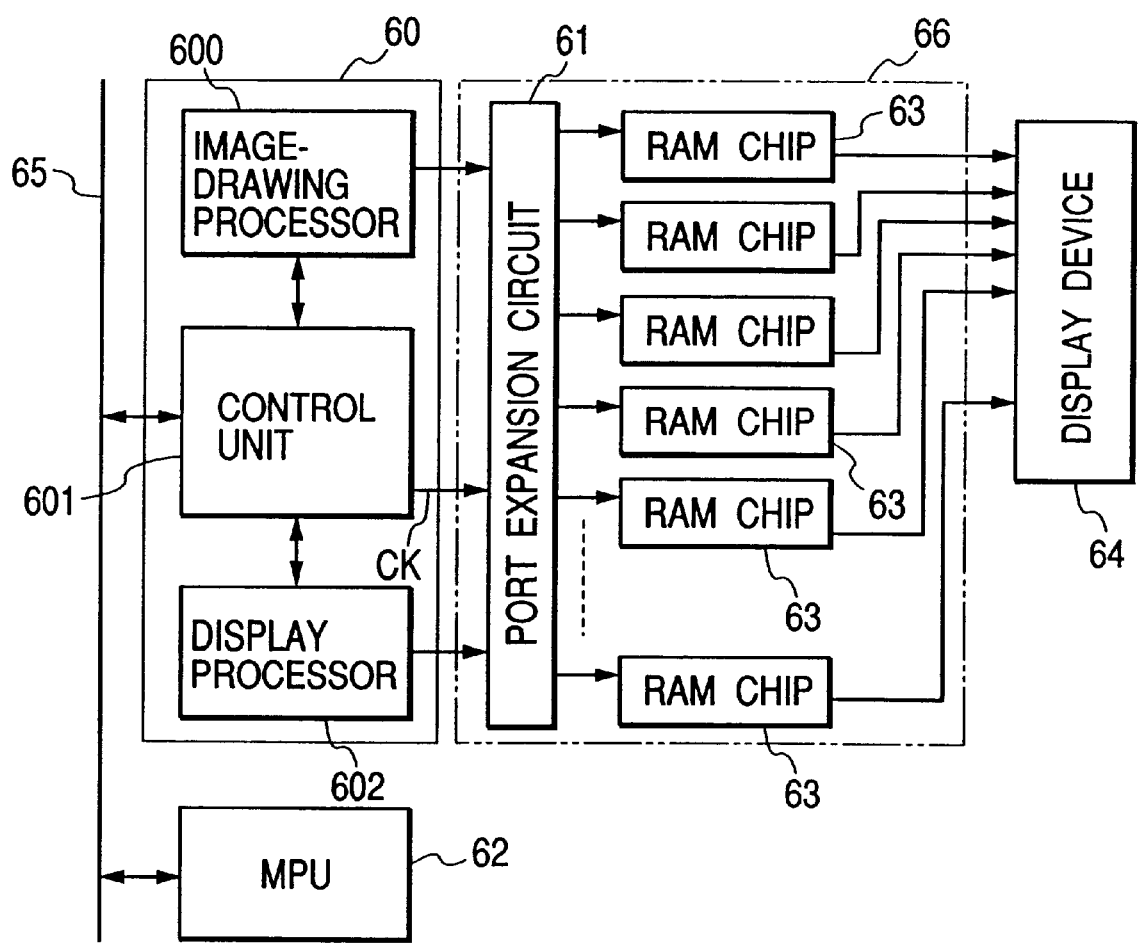
FIG. 18 is a block diagram depicting one embodiment of a data processing system utilizing a multiport memory using a port expansion circuit as a frame buffer memory.

FIG. 18 shows one example of a data processing system wherein a multiport memory is constructed using a port expansion circuit. Although not restricted in particular, the data processing system shown in the same drawing comprises a microprocessor 62, a graphics controller 60, a port expansion circuit 61, a plurality of RAM chips 63 and a display device 64. Designated at numeral 65 is a bus used for addresses, data and control signals or the like.

General-purpose single port or dual port RAM chips can be used for the RAM chips 63. They can be constructed so as to be able to function as a multiport memory by the port expansion circuit 61 and are utilized as a frame buffer memory 66.

The graphics controller 60 has an image-drawing processor 600, a display processor 602 and a control unit 601. The control unit 601 receives therein a command and display data or the like sent from an MPU 62. The control unit 601 controls the image-drawing processor 600 according to the result of decoding of the received command so as to allow each RAM chip 63 to output an image-drawing address and image-drawing data. Further, the control unit 601 controls the display processor 602 according to the result of decoding of the received command to thereby allow the display device 64 to output the display data drawn in the corresponding RAM chip 63. The display device displays and drives a display with a raster-scan system according to display data for a display frame, which is supplied from the RAM chip 63.

The port expansion circuit 61 has a circuit configuration similar to the aforementioned port expansion circuits 15, 25, 35 and 45. That is, the port expansion circuit 61 is electrically connected to the graphics controller 60 and electrically connected to access ports of the plurality of RAM chips 63 to allow the plurality of RAM chips 63 to be accessed as a single multiport memory apparently. The port expansion circuit 61 has an input circuit for allowing access control information for activating the plurality of RAM chips 63 in parallel every memory cycles to be collectively inputted thereto by a plurality of memory cycles, a timing generator for generating the control clock signals φ1, φ2, etc. capable of prescribing the memory cycles on a series basis plural times during one cycle of a synchronizing clock signal CK of the graphics controller 60, and a logic circuit capable of sequentially supplying the access control information of the input circuit to the plurality of RAM chips 63 in parallel in parts every serial memory cycles synchronized with the control clock signals φ1, φ2, etc. The port expansion circuit 61 can make use of one brought to a semiconductor integrated circuit or one comprised of a TTL circuit or the like. Incidentally, it is desirable that the port expansion circuit 32 explained in FIG. 10 is adopted as the port expansion circuit 61 when a write access for image drawing with respect to the frame buffer and a read access for display are exclusively executed asynchronously. This is because the port expansion circuit 32 can arbitrarily specify the read and/or write for each port.

If the port expansion circuit 61 is used in the data processing system shown in FIG. 18, then a multiport memory provided with a required number of read ports apparently can be easily implemented using single port or dual port general-purpose RAM chips such as DRAM or SDRAM or the like. The multiport memory implemented in this way functionally exhibits the same function as the above-described multiport memories 1, 2, 3 and 4. Accordingly, a frame buffer corresponding to a display size can be easily implemented using the single port or dual port general-purpose RAM chips such as DRAM or SDRAM or the like. Further, the data processing system using the multiport memory can be reduced in the amount of power consumption.

While the invention, which has been made above by the present inventors, has been described specifically by the embodiments, the present invention is not necessarily limited to them. It is needless to say that many changes can be made thereto within the scope not departing from the substance of the invention.

For example, a bus master module is not limited to a CPU, a microprocessor and graphics controller. It may be a protocol controller, a direct memory access controller or the like. Further, while the data input and output terminals are configured as separate external terminals even if the aforementioned RAM chips and RAM modules are of single-port RAMs, they may be constructed as a common data input/output terminal if not used as parallel-accessed terminals.

While the above description has principally been made of the case in which the invention made by the present inventors is applied to the multiport memory, the data processor and the display system or the like which belong to the application field thereof showing the background thereof, they can be widely applied to a computer system or the like such as a personal computer, a work station or the like.

Effects obtained by a typical one of the inventions disclosed in the present application will be briefly described as follows.

That is, since each individual RAMs are serially operated to increase the number of multiport or multiple ports apparently, the number of RAMs to be activated in parallel can be reduced, thereby making it possible to contribute to low power consumption as compared with the prior art. Further, since a plurality of RAMs are used, the individual RAMs can be substantially accessed in parallel as regards a read access even when each individual RAMs are given in the form of a single port, whereby a delay in apparent parallel read access to be executed from the outside can be improved.

If the data processor provided with the port expansion circuit is used as an external interface circuit, then a multiport memory provided with a required number of read ports apparently can be easily implemented using single port or dual port general-purpose RAM chips such as DRAM or SDRAM or the like.

If a data processing system is constructed using a port expansion circuit, then the data processing system using a multiport memory can be reduced in cost and the amount of power consumption.

We claim:

1. A semiconductor integrated circuit comprising:
    a plurality of RAMs each of which has address terminals and data terminals;
    a first circuit which receives first address signals and second address signals in parallel in synchronism with a first clock signal; and
    a second circuit which supplies said first address signals and said second address signals to said address terminals in serial in synchronism with a second clock signal higher than said first clock signal in frequency,
    wherein said plurality of RAMs are activated in parallel in synchronism with said second clock signal.

2. A semiconductor integrated circuit according to claim 1,
    wherein two or more cycles of said second clock signal are included in one cycle of said first clock signal,
    wherein a read operation from said plurality of RAMs is performed in a first cycle of said second clock signal, and
    wherein a write operation to said plurality of RAMs is performed in a second cycle subsequent to said first cycle.

3. A semiconductor integrated circuit according to claim 1,
    wherein two or more cycles of said second clock signal are included in one cycle of said first clock signal,
    wherein a first write operation to said plurality of RAMs is performed in a first cycle of said second clock signal, and
    wherein a second write operation to said plurality of RAMs is performed in a second cycle subsequent to said first cycle.

* * * * *